United States Patent
Maruo et al.

(10) Patent No.: US 11,462,841 B2
(45) Date of Patent: *Oct. 4, 2022

(54) ANTENNA APPARATUS AND MEASUREMENT METHOD

(71) Applicant: ANRITSU CORPORATION, Kanagawa (JP)

(72) Inventors: Tomohiko Maruo, Kanagawa (JP); Aya Yamamoto, Kanagawa (JP)

(73) Assignee: ANRITSU CORPORATION, Kanagawa (JP)

(*) Notice: Subject to any disclaimer, the term of this patent is extended or adjusted under 35 U.S.C. 154(b) by 352 days.

This patent is subject to a terminal disclaimer.

(21) Appl. No.: 16/591,707

(22) Filed: Oct. 3, 2019

(65) Prior Publication Data
US 2020/0119460 A1 Apr. 16, 2020

(30) Foreign Application Priority Data
Oct. 12, 2018 (JP) .............................. JP2018-193796

(51) Int. Cl.
*H01Q 1/24* (2006.01)
*H01Q 21/28* (2006.01)
*H01Q 21/29* (2006.01)

(52) U.S. Cl.
CPC ............. *H01Q 21/28* (2013.01); *H01Q 1/241* (2013.01); *H01Q 21/29* (2013.01)

(58) Field of Classification Search
CPC ........ H01Q 21/28; H01Q 1/241; H01Q 21/29; H01Q 3/18; H01Q 1/225; H01Q 19/17; H01Q 21/30; G01R 29/105; G01R 29/10; G01R 29/0821; G01R 29/0878; G01R 29/0892

See application file for complete search history.

(56) References Cited

U.S. PATENT DOCUMENTS

| 4,709,238 A * | 11/1987 | Green | G01S 3/44 342/155 |
| 10,763,979 B2 * | 9/2020 | Maruo | H04B 17/15 |
| 2010/0109932 A1 * | 5/2010 | Liu | H01Q 19/022 342/1 |
| 2010/0285753 A1 * | 11/2010 | Foegelle | H04B 17/21 455/67.12 |

FOREIGN PATENT DOCUMENTS

| CN | 200941426 Y * | 8/2007 |
| JP | 2009-147687 A | 7/2009 |

* cited by examiner

*Primary Examiner* — Dimary S Lopez Cruz
*Assistant Examiner* — Michael M Bouizza
(74) *Attorney, Agent, or Firm* — Pearne & Gordon LLP

(57) ABSTRACT

An antenna apparatus 1 includes: an anechoic box 50 having the internal space 51 that is not influenced by the surrounding radio wave environment; a plurality of antennas 6 that use radio signals in a plurality of divided frequency bands set in advance; a reflector 7 that is housed in the internal space and has a predetermined paraboloid of revolution, radio signals transmitted or received by an antenna 110 of a DUT 100 being reflected through the paraboloid of revolution; and antenna arrangement means 60 for sequentially arranging the plurality of receiving antennas 6 at a focal position F, which is determined from the paraboloid of revolution, according to the divided frequency bands.

17 Claims, 12 Drawing Sheets

|   | AntennaUnit ||
|   | Frequency ||
|   | Lower | Upper |
| --- | --- | --- |
| 1 | 6 GHz | 18 GHz |
| 2 | 18 GHz | 26 GHz |
| 3 | 26 GHz | 40 GHz |
| 4 | 40 GHz | 60 GHz |
| 5 | 60 GHz | 76 GHz |
| 6 | 76 GHz | 90 GHz |
| ⋮ | ⋮ | ⋮ |

FIG. 8

ANTENNA APPARATUS AND MEASUREMENT METHOD

TECHNICAL FIELD

The present invention relates to an antenna apparatus and a measurement method for performing spurious measurement in the vicinity of a radio signal used by an antenna to be tested using an anechoic box in an over the air (OTA) environment.

BACKGROUND ART

In recent years, with the development of multimedia, wireless terminals (smartphones and the like) in which an antenna for wireless communication, such as cellular and wireless LAN, is mounted are being actively produced. In the future, in particular, there is a demand for a wireless terminal that transmits and receives radio signals corresponding to IEEE 802.11ad, 5G cellular, and the like that use broadband signals in a millimeter wave band.

In a wireless terminal manufacturing plant, a performance test is performed in which the output level or the reception sensitivity of the transmission radio wave defined for each communication standard is measured for a wireless communication antenna provided in a wireless terminal to determine whether or not a predetermined standard is satisfied.

With the transition of generation from 4G or 4G advance to 5G, a test method for the performance test described above is also changing. For example, in a performance test in which a wireless terminal for 5G new radio system (NR system) (hereinafter, a 5G wireless terminal) is a device under test (DUT), cable connection between the antenna terminal of the DUT and a testing device, which is a mainstream in tests of 4G, 4G advance, and the like, cannot be used. For this reason, a so-called OTA test is performed in which the DUT is housed in a box, which is not influenced by the surrounding radio wave environment, together with a test antenna and transmission of a test signal from the test antenna to the DUT and reception of a measurement target signal from the DUT, which has received the test signal, by the test antenna are performed by wireless communication.

In addition, for 5G wireless terminals, the revision of the 5G NR standard mandates spurious measurement in addition to the performance test described above. The spurious measurement is a technique for measuring how much unnecessary radio wave, that is, spurious wave is radiated in the other band during communication at the target oscillation frequency of the 5G wireless terminal.

In the performance test of the 5G wireless terminal, a compact antenna test range (hereinafter, a CATR) is known as test equipment for realizing the OTA test environment and the spurious measurement environment described above. The CATR includes an anechoic box called an OTA chamber, and houses the DUT, the test antenna, and a plurality of receiving antennas for spurious measurement so that intrusion of radio waves from the outside and radiation of radio waves to the outside are prevented. In addition, in the CATR, a reflector having a paraboloid of revolution is arranged in the signal propagation path between the antenna of the DUT and the test antenna. Therefore, since the signal propagation path can be shortened compared with a case where no reflector is used, the CATR is characterized in that compactness can be literally realized compared with the OTA test in a general far-field environment.

In a measurement apparatus using the CATR, a test signal is transmitted from the test antenna to be received by the DUT in the OTA chamber, and a measurement target signal transmitted from the DUT that has received the test signal is received by the test antenna and the performance test described above is performed. In addition, in the measurement apparatus, radio signals in the spurious frequency band radiated from the DUT together with the measurement target signal are received by a plurality of receiving antennas and analyzed for each frequency band corresponding to each receiving antenna.

For a conventional antenna measurement apparatus using a plurality of test antennas, there is known a technique for simultaneously transmitting a plurality of beams with the same frequency, on which different codes are superimposed, through a multi-beam antenna and simultaneously measuring all beams radiated from the multi-beam antenna while suppressing the influence of unnecessary waves due to encoding on the plurality of beams with the same frequency (for example, refer to Patent Document 1).

RELATED ART DOCUMENT

[Patent Document]
[Patent Document 1] JP-A-2009-147687

DISCLOSURE OF THE INVENTION

Problem that the Invention is to Solve

In the general CATR, one receiving antenna for spurious measurement is arranged at the focal position of the above-described reflector in the internal space (anechoic box), which is not influenced by the surrounding radio wave environment, so that it is possible to measure radio signals in the spurious frequency band radiated together with the measurement target signal from the antenna of the DUT. In order to perform spurious measurement in a wide frequency band defined in the 5G NR standard, the spurious frequency band is subdivided into a plurality of divided frequency bands, and a plurality of receiving antennas corresponding to the respective divided frequency bands are required. Therefore, in the spurious measurement of all the divided frequency bands, a work for sequential replacement of each receiving antenna at the focal position of the reflector is required.

For this reason, in the conventional measurement apparatus using the CATR, in order to perform the spurious measurement, it is necessary to manually replace the receiving antennas one by one at the focal position of the reflector in the anechoic box so that a plurality of receiving antennas for spurious measurement can be housed in the anechoic box and switchably used. In this method, it is necessary to secure a place for storing the plurality of receiving antennas in the anechoic box, and it takes time and effort to take out one receiving antenna from the place and install the receiving antenna at the focal position. This causes an increase in the size of the anechoic box. In addition, a complicated work for replacement of the receiving antenna is required, and the measurement processing also becomes complicated.

In addition, although Patent Document 1 discloses a technique for reflecting radio waves radiated from each antenna forming a multi-beam antenna on a mirror surface and measuring the radio waves and a technique for rotating each antenna, each antenna could not be switched to the focal position of the mirror surface. In addition, Patent Document discloses rotating each antenna merely to change the position of each antenna, but each antenna is not sequentially arranged at the focal position of the mirror surface.

The present invention has been made to solve such conventional problems, and it is an object of the present invention to provide an antenna apparatus and a measurement method capable of realizing efficient spurious measurement in a wide frequency band for a DUT, which transmits and receives radio signals in a millimeter wave band, while avoiding an increase in the size of an anechoic box and the complication of a work for replacement of receiving antennas.

Means for Solving the Problem

In order to solve the aforementioned problem, an antenna apparatus according to a first aspect of the present invention includes: an anechoic box having an internal space that is not influenced by a surrounding radio wave environment; a plurality of antennas that use radio signals in a plurality of divided frequency bands set in advance; a reflector that is housed in the internal space and has a predetermined paraboloid of revolution, radio signals transmitted or received by an antenna to be tested provided in a device under test being reflected through the paraboloid of revolution; and antenna arrangement means for sequentially arranging the plurality of antennas at a focal position, which is determined from the paraboloid of revolution, according to the divided frequency bands.

With this configuration, in the antenna apparatus according to the first aspect of the present invention, since the antenna arrangement means is provided in the anechoic box, the user does not need to perform a work for sequential replacement of the plurality of antennas at the focal position of the reflector during the spurious measurement. In addition, since the antenna arrangement means is added after shortening the signal propagation path by providing the reflector, this is not a major obstacle for the anechoic box to be made compact. In addition, since spurious measurement in each divided frequency band can be performed without interruption while reducing the time and effort for arranging each antenna, the efficiency of the measurement processing can be improved.

In an antenna apparatus according to a second aspect of the present invention, the antenna to be tested uses a radio signal in a specified frequency band, and the divided frequency bands are partial frequency bands of a predetermined spurious frequency band from a frequency band lower than the specified frequency band to a frequency band higher than the specified frequency band. The anechoic box further includes: a test antenna that uses a radio signal in the specified frequency band; a simulation measurement device that outputs a test signal to the device under test through the test antenna, receives a measurement target signal output from the device under test, to which the test signal has been input, through the test antenna, and measures a radio signal in the specified frequency band based on the received measurement target signal; and a signal analysis device that receives a radio signal in the spurious frequency band, which is output together with the measurement target signal from the device under test to which the test signal has been input, through each of the antennas corresponding to the divided frequency bands and analyzes a frequency distribution and power of the received radio signal in the spurious frequency band.

With this configuration, for the DUT having an antenna to be tested that uses a radio signal in a specified frequency band, the antenna apparatus according to the second aspect of the present invention can easily measure a spurious signal, which is radiated from the DUT, in a predetermined spurious frequency band from a frequency band lower than the specified frequency band to a frequency band higher than the specified frequency band.

In an antenna apparatus according to a third aspect of the present invention, the antenna arrangement means operates automatically, and includes: an antenna holding mechanism that is provided in the internal space of the anechoic box such that each of the antennas is arranged on a circumference around a rotary shaft in a rotating body rotatable with the rotary shaft as a center, the focal position is located on the circumference, and each of the antennas passes through the focal position by rotation of the rotating body; a power unit having a driving motor for rotationally driving the rotating body through the rotary shaft; and an automatic antenna arrangement control unit that controls the driving motor such that each of the antennas is sequentially stopped at the focal position according to the divided frequency bands.

With this configuration, since the antenna apparatus according to the third aspect of the present invention adopts the antenna holding mechanism in which each antenna is arranged on the circumference around the rotary shaft for the rotating body rotatable with the rotary shaft as the center, it is possible to reduce the installation space of the antenna holding mechanism while keeping the anechoic box compact.

In an antenna apparatus according to a fourth aspect of the present invention, the antenna holding mechanism is provided on a bottom surface of the internal space of the anechoic box, and is formed by the rotating body rotatable along a plane in a horizontal direction by the rotary shaft along a vertical direction.

With this configuration, in the antenna apparatus according to the fourth aspect of the present invention, a space horizontal to the bottom surface of the internal space of the anechoic box is secured as an installation space of the antenna holding mechanism. Therefore, it is possible to prevent an increase in the height of the anechoic box.

In an antenna apparatus according to a fifth aspect of the present invention, the antenna holding mechanism holds each of the antennas such that a receiving surface of each of the antennas is directed to the rotary shaft side.

With this configuration, in the antenna apparatus according to the fifth aspect of the present invention, the antenna holding mechanism is arranged at the central portion of the bottom surface of the internal space of the anechoic box. Therefore, since the diameter of the circumference on which each antenna is arranged can be reduced, it is possible to keep the antenna holding mechanism and the anechoic box compact.

In an antenna apparatus according to a sixth aspect of the present invention, the antenna holding mechanism holds each of the antennas such that a receiving surface of each of the antennas is directed to an opposite side to the rotary shaft side.

With this configuration, in the antenna apparatus according to the sixth aspect of the present invention, the antenna holding mechanism is arranged at a position near the side surface avoiding the central portion of the bottom surface of the internal space of the anechoic box. Therefore, since the diameter of the circumference on which each antenna is arranged can be reduced, it is possible to keep the antenna holding mechanism and the anechoic box compact.

In an antenna apparatus according to a seventh aspect of the present invention, in a case where each of the antennas is stopped at the focal position, the antenna holding mechanism holds the antenna so as to face the reflector at an angle at which a receiving surface of the antenna is perpendicular to a beam axis of the radio signal.

With this configuration, in the antenna apparatus according to the seventh aspect of the present invention, it is possible to improve the reception accuracy of each antenna arranged at the focal position of the reflector and improve the spurious measurement accuracy.

In an antenna apparatus according to an eighth aspect of the present invention, the antenna holding mechanism is provided on a bottom surface of the internal space of the anechoic box, and is formed by the rotating body rotatable along a plane in a vertical direction by the rotary shaft along a horizontal direction.

With this configuration, in the antenna apparatus according to the eighth aspect of the present invention, a space perpendicular to the bottom surface of the internal space of the anechoic box is secured as an installation space of the antenna holding mechanism. Therefore, it is possible to prevent an increase in the width of the anechoic box.

In an antenna apparatus according to a ninth aspect of the present invention, the antenna arrangement means includes: an antenna holding mechanism that has a first slide mechanism that holds a plurality of antenna pedestals, on which the antennas are provided, so as to be slidable in one direction while maintaining a predetermined interval and a second slide mechanism that slidably holds the first slide mechanism in the other direction perpendicular to the one direction through a pedestal portion and that is provided in the internal space of the anechoic box such that each of the antennas is able to pass through the focal position; a power unit that includes a first driving motor for rotationally driving a first driving shaft for sliding each of the antenna pedestals in the one direction and a second driving motor for rotationally driving a second driving shaft for sliding the pedestal portion in the other direction; and an automatic antenna arrangement control unit that controls the first and second driving motors such that each of the antennas is sequentially stopped at the focal position according to the divided frequency bands.

With this configuration, in the antenna apparatus according to the ninth aspect of the present invention, a space horizontal to the bottom surface of the internal space of the anechoic box is secured as an installation space of the antenna holding mechanism. Therefore, it is possible to prevent an increase in the height of the anechoic box. In addition, since the antennas slide in directions perpendicular to each other on the horizontal plane, stable movement toward the focal position is possible.

In an antenna apparatus according to a tenth aspect of the present invention, a plurality of the first slide mechanisms are provided so as to be parallel to the one direction and be spaced apart from each other by a predetermined distance in the other direction, and the power unit includes the first driving motor corresponding to each of the first slide mechanisms.

With this configuration, the antenna apparatus according to the tenth aspect of the present invention can easily cope with the addition of each antenna while avoiding an increase in the size of the anechoic box by making full use of the space in the horizontal direction on the bottom surface of the anechoic box.

In an antenna apparatus according to an eleventh aspect of the present invention, the antenna arrangement means operates automatically, and includes: an antenna holding mechanism that is provided in the internal space of the anechoic box such that each of the antennas is arranged on a circumference around a rotary shaft in a rotating body rotatable with the rotary shaft as a center, the focal position is located on the circumference, and each of the antennas passes through the focal position by rotation of the rotating body; a power unit having a driving motor for rotationally driving the rotating body through the rotary shaft; and an automatic antenna arrangement control unit that controls the driving motor such that each of the antennas is sequentially stopped at the focal position according to the divided frequency bands.

In an antenna apparatus according to a twelfth aspect of the present invention, the antenna holding mechanism holds each of the antennas such that a receiving surface of each of the antennas is directed to the rotary shaft side.

In an antenna apparatus according to a thirteenth aspect of the present invention, the antenna holding mechanism holds each of the antennas such that a receiving surface of each of the antennas is directed to an opposite side to the rotary shaft side.

In an antenna apparatus according to a fourteenth aspect of the present invention, in a case where each of the antennas is stopped at the focal position, the antenna holding mechanism holds the antenna so as to face the reflector at an angle at which a receiving surface of the antenna is perpendicular to a beam axis of the radio signal.

In an antenna apparatus according to a fifteenth aspect of the present invention, in a case where each of the antennas is stopped at the focal position, the antenna holding mechanism holds the antenna so as to face the reflector at an angle at which a receiving surface of the antenna is perpendicular to a beam axis of the radio signal.

In an antenna apparatus according to a sixteenth aspect of the present invention, in a case where each of the antennas is stopped at the focal position, the antenna holding mechanism holds the antenna so as to face the reflector at an angle at which a receiving surface of the antenna is perpendicular to a beam axis of the radio signal.

In an antenna apparatus according to a seventeenth aspect of the present invention, the antenna arrangement means includes: an antenna holding mechanism that has a first slide mechanism that holds a plurality of antenna pedestals, on which the antennas are provided, so as to be slidable in one direction while maintaining a predetermined interval and a second slide mechanism that slidably holds the first slide mechanism in the other direction perpendicular to the one direction through a pedestal portion and that is provided in the internal space of the anechoic box such that each of the antennas is able to pass through the focal position; a power unit that includes a first driving motor for rotationally driving a first driving shaft for sliding each of the antenna pedestals in the one direction and a second driving motor for rotationally driving a second driving shaft for sliding the pedestal portion in the other direction; and an automatic antenna arrangement control unit that controls the first and second driving motors such that each of the antennas is sequentially stopped at the focal position according to the divided frequency bands.

A measurement method according to an eighteenth aspect of the present invention is a measurement method using an antenna apparatus that includes an anechoic box having an internal space that is not influenced by a surrounding radio wave environment, a plurality of antennas corresponding to radio signals in a plurality of divided frequency bands set in advance, a reflector that is housed in the internal space and has a predetermined paraboloid of revolution, radio signals transmitted or received by an antenna to be tested provided in a device under test being reflected through the paraboloid of revolution, and antenna arrangement means for sequentially arranging the plurality of antennas at a focal position, which is determined from the paraboloid of revolution, according to the divided frequency bands, the method includes: a holding step of holding the device under test in a device under test holding unit in the anechoic box; an antenna arrangement step of sequentially arranging the plurality of antennas at the focal position according to the divided frequency bands based on a predetermined spurious measurement start command; a test signal output step of causing a simulation measurement device to output a test signal to the device under test through the test antenna; a signal receiving step of receiving a radio signal in the spurious frequency band, which is output together with the measurement target signal from the device under test to which the test signal has been input, through each of the antennas corresponding to the divided frequency bands; and an analysis step of analyzing a frequency distribution and power of the radio signal in the spurious frequency band received in the signal receiving step.

With this configuration, since the measurement method according to the eleventh aspect of the present invention uses the antenna apparatus having an anechoic box in which antenna arrangement means is provided, the user does not need to perform a work for sequential replacement of the plurality of antennas at the focal position of the reflector during the spurious measurement. In addition, since spurious measurement in each divided frequency band can be performed without interruption while reducing the time and effort for arranging each antenna, the efficiency of the measurement processing can be improved.

Advantage of the Invention

The present invention can provide an antenna apparatus and a measurement method capable of realizing efficient spurious measurement in a wide frequency band for a DUT, which transmits and receives radio signals in a millimeter wave band, while avoiding an increase in the size of an anechoic box and the complication of the work for replacement of a receiving antenna.

BRIEF DESCRIPTION OF THE DRAWINGS

FIG. 8 is a table showing the use frequency classification of a plurality of receiving antennas for spurious measurement adopted in the OTA chamber of the measurement apparatus according to the first embodiment of the present invention.

BEST MODE FOR CARRYING OUT THE INVENTION

First Embodiment

Figure 1:
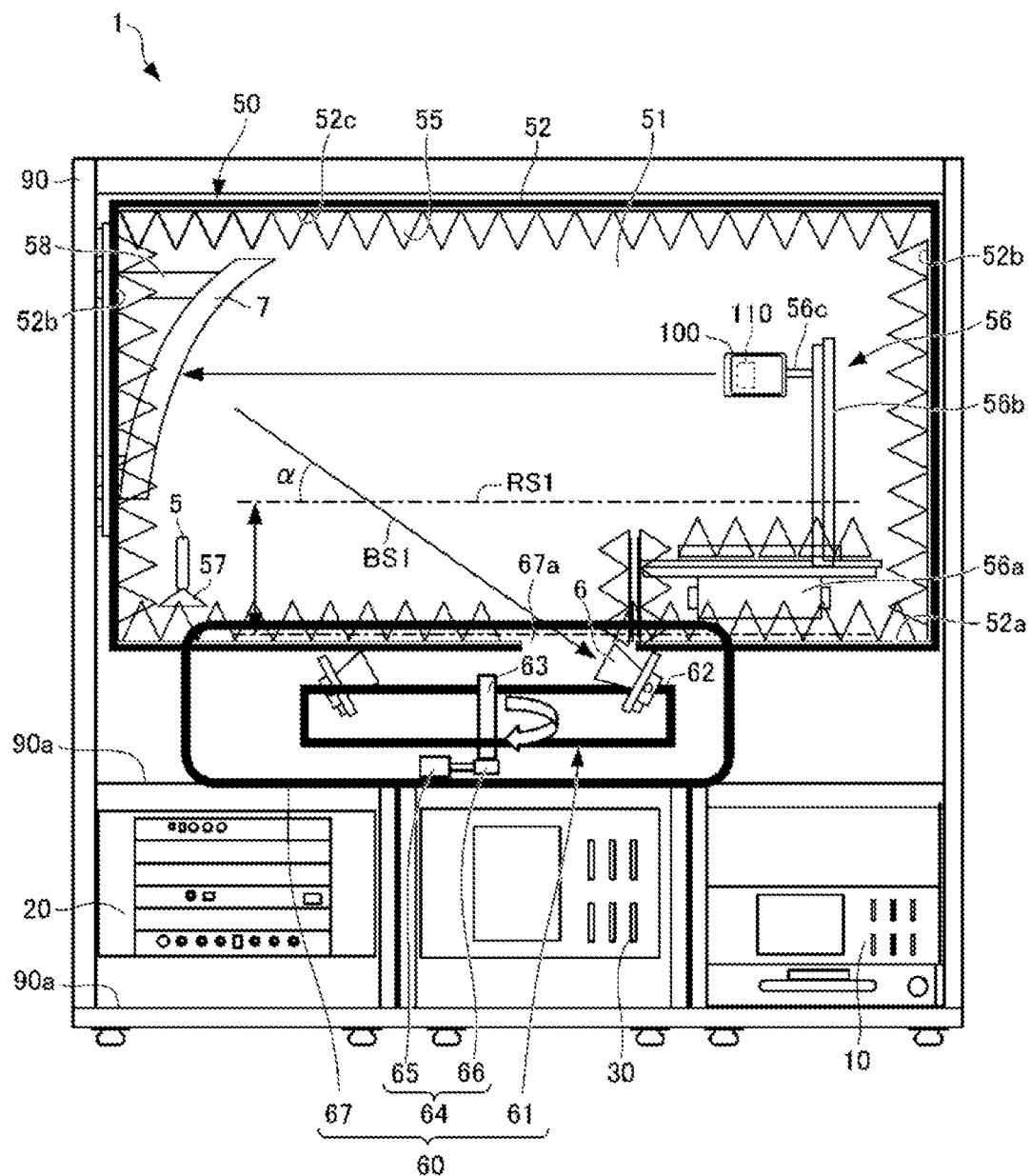
FIG. 1 is a diagram showing the schematic configuration of the entire measurement apparatus according to a first embodiment of the present invention.
Figure 2:
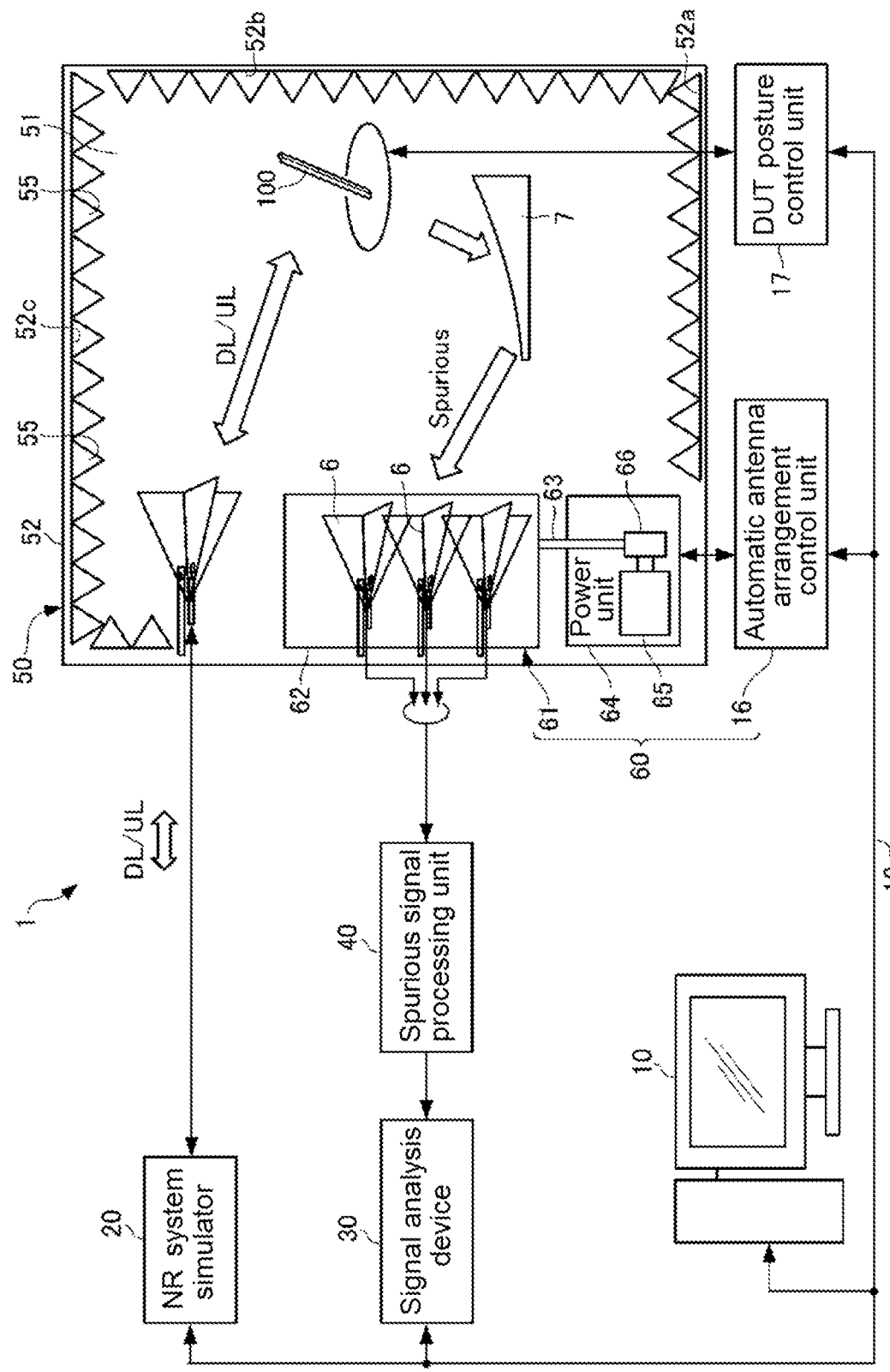
FIG. 2 is a block diagram showing the functional configuration of the measurement apparatus according to the first embodiment of the present invention.

First, the configuration of a measurement apparatus 1 according to a first embodiment of the present invention will be described with reference to FIGS. 1 to 8. The measurement apparatus 1 corresponds to an antenna apparatus of the present invention. The measurement apparatus 1 according to the present embodiment has an appearance structure shown in FIG. 1 as a whole, and is configured by functional blocks as shown in FIG. 2. FIG. 1 shows the arrangement of components in a state in which an OTA chamber 50 is seen through from the side surface.

As shown in FIGS. 1 and 2, the measurement apparatus 1 according to the present embodiment has an integrated control device 10, an NR system simulator 20, a signal analysis device 30, a spurious signal processing unit 40, and the OTA chamber 50.

The integrated control device 10 is communicably connected to the NR system simulator 20 and the signal analysis device 30 through a network 19, such as Ethernet (registered trademark). In addition, the integrated control device 10 is also connected to control target elements in the OTA chamber 50 through the network 19. The measurement apparatus 1 has an automatic antenna arrangement control unit and a DUT posture control unit 17 as control target elements in the OTA chamber 50.

The integrated control device 10 performs overall control of control target elements in the NR system simulator 20, the signal analysis device 30, and the OTA chamber 50 through the network 19, and is, for example, a personal computer (PC). The automatic antenna arrangement control unit 16 and the DUT posture control unit 17 may be provided in the integrated control device 10, for example, as shown in FIG.

3. The following explanation will be given on the assumption that the integrated control device 10 has a configuration shown in FIG. 3.

The measurement apparatus 1 is operated, for example, in a state in which each component is mounted on each rack 90a using a rack structure 90 having a plurality of racks 90a shown in FIG. 1. In FIG. 1, an example is mentioned in which the integrated control device 10, the NR system simulator 20, the signal analysis device 30, and the OTA chamber 50 are mounted on each rack 90a of the rack structure 90.

Here, for the sake of convenience, the configuration of the OTA chamber 50 will be described first. The OTA chamber realizes an OTA test environment and a spurious measurement environment in testing a 5G wireless terminal, and is used as an example of the CATR described above.

As shown in FIGS. 1 and 2, for example, the OTA chamber is formed by a metal housing main body 52 having a rectangular parallelepiped internal space 51. In the internal space 51, a DUT 100, one test antenna 5 facing an antenna 110 of the DUT 100, and a plurality of receiving antennas 6 for spurious measurement are housed so that intrusion of radio waves from the outside and radiation of radio waves to the outside are prevented. In the internal space 51 of the OTA chamber 50, the reflector 7 for realizing a radio wave path for returning the radio signal radiated from the antenna 110 of the DUT 100 to the light receiving surface of the receiving antenna 6 is further arranged. The receiving antenna 6 configures a plurality of antennas in the present invention. In addition, a radio wave absorber 55 is bonded to the entire inner surface of the OTA chamber 50, that is, the entire bottom surface 52a, side surface 52b, and upper surface 52c of the housing main body 52, so that a function of restricting the radiation of radio waves to the outside is strengthened. Thus, the OTA chamber 50 realizes an anechoic box having the internal space 51 that is not influenced by surrounding radio wave environment. The anechoic box used in the present embodiment is of an anechoic type, for example.

The DUT 100 to be tested is, for example, a wireless terminal such as a smartphone. As a communication standard of the DUT 100, cellular (LTE, LTE-A, W-CDMA (registered trademark), GSM (registered trademark), CDMA2000, 1×EV-DO, TD-SCDMA, and the like), wireless LAN (IEEE 802.11b/g/a/n/ac/ad and the like), Bluetooth (registered trademark), GNSS (GPS, Galileo, GLONASS, BeiDou, and the like), FM, and digital broadcasting (DVB-H, ISDB-T, and the like) can be mentioned. In addition, the DUT 100 may also be a wireless terminal that transmits and receives radio signals in a millimeter wave band corresponding to IEEE 802.11ad, 5G cellular, and the like.

In the present embodiment, the antenna 110 of the DUT 100 uses, for example, a radio signal in a specified frequency band (millimeter wave band) conforming to the 5G NR standard. The test antenna 5 arranged in the OTA chamber 50 uses a radio signal in the same frequency band as the antenna 110 of the DUT 100. On the other hand, the plurality of receiving antennas 6 use radio signals in a plurality of divided frequency bands set in advance in a predetermined spurious frequency band from a frequency band lower than the above-described specified frequency band to a frequency band higher than the specified frequency band.

FIG. 8 is a table showing the use frequency classification of the plurality of receiving antennas 6 arranged in the OTA chamber 50 according to the present embodiment. In FIG. 8, the entire frequency band of 6 GHz to GHz used by the plurality of receiving antennas 6 is divided into a plurality of bands (divided frequency bands) of 6 GHz to 18 GHz, 18 GHz to 26 GHz, 26 GHz to 40 GHz, 40 GHz to 60 GHz, 60 GHz to 76 GHz, 76 GHz to 90 GHz, corresponding to the numbers 1, 2, 3, 4, 5, 6, . . . , for example.

In the present embodiment, in the OTA chamber 50, for example, six receiving antennas 6 using divided frequency bands corresponding to the numbers 1, 2, 3, 4, 5, and 6 in the use frequency classification in FIG. 8 are arranged in the internal space 51. In addition, the OTA chamber 50 may be configured to adopt, as the test antenna 5, an antenna that uses a frequency band of 24.25 GHz to 43.5 GHz as a predetermined frequency band in the use frequency classification shown in FIG. 8.

Next, the arrangement of the test antenna 5, the receiving antenna 6, and the reflector 7 in the internal space 51 of the OTA chamber 50 will be described. In the OTA chamber 50, a DUT holding unit 56 extending in a vertical direction is provided on the bottom surface 52a of the housing main body 52 in the internal space 51. The DUT holding unit 56 has a driving unit 56a provided on the bottom surface 52a, a support stand 56b connected to the driving unit 56a, and a DUT mounting unit 56c extending in a horizontal direction from the side surface of the support stand 56b. The driving unit 56a is formed by, for example, a two-axis positioner including a rotation mechanism that rotates in two axial directions. Hereinafter, the driving unit 56a may be referred to as a two-axis positioner (refer to FIG. 3). Therefore, the DUT holding unit 56 can rotate the DUT 100 held by the DUT mounting unit 56c so as to be located at the center of the sphere and to be able to sequentially change the posture to a state in which the antenna 110 is directed to all points on the surface of the sphere, for example.

In the OTA chamber 50, the test antenna 5 is attached to a required position of the side surface 52b of the housing main body 52 using a holder 57. The test antenna 5 is held by the holder 57 so as to have directivity with respect to the DUT 100 held by the DUT holding unit 56.

In the OTA chamber 50, the plurality of receiving antennas 6 are held so as to be separated from each other by an antenna holding mechanism 61. In the present embodiment, for example, six receiving antennas 6 corresponding to the respective divided frequency bands shown in FIG. 8 are held by the antenna holding mechanism 61. The antenna holding mechanism 61 is attached to the bottom surface 52a in the internal space 51 of the OTA chamber 50 through a power unit 64. The antenna holding mechanism 61 forms automatic antenna arrangement means 60 together with the power unit 64 and the automatic antenna arrangement control unit 16 (refer to FIG. 2). The automatic antenna arrangement means 60 forms antenna arrangement means of the present invention. The configuration of the automatic antenna arrangement means 60 will be described in detail later.

In the OTA chamber 50, the reflector 7 has an offset parabola (refer to FIG. 7) type structure to be described later. As shown in FIG. 1, the reflector 7 is attached to a required position of the side surface 52b of the OTA chamber 50 using a reflector holder 58. The reflector 7 is held by the reflector holder 58 in such a posture that the radio signal from the antenna 110 of the DUT 100 held by the DUT holding unit 56 can be incident on the paraboloid of revolution. The reflector 7 is arranged at a position and posture where the radio signal in the spurious frequency band radiated from the antenna 110 together with a measurement target signal by the DUT 100 having received the test signal can be received on the paraboloid of revolution and be reflected toward one receiving antenna 6 arranged at a focal position F of the paraboloid of revolution.

Figure 5A:
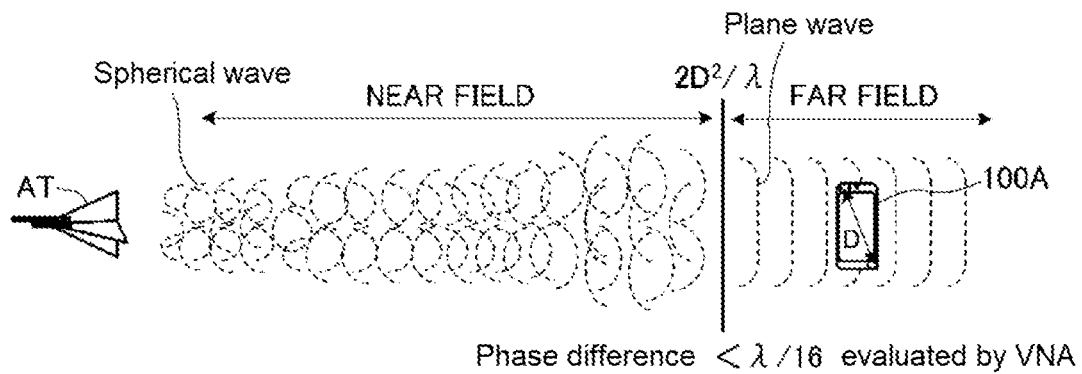
FIGS. 5A and 5B are schematic diagrams illustrating a near field and a far field in radio wave propagation between an antenna AT and a wireless terminal.
Figure 5B:
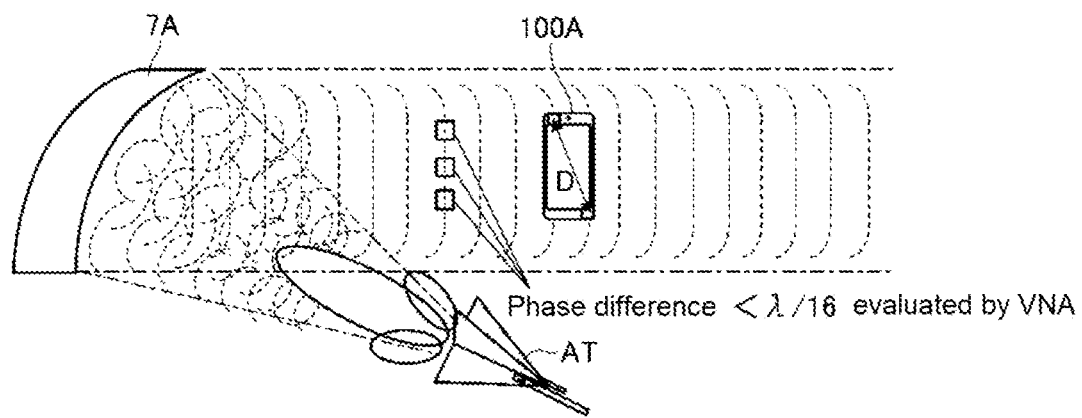

Here, the merit of mounting the reflector 7 in the OTA chamber 50 and the preferable form of the reflector 7 will be described with reference to FIGS. 5A to 7. FIGS. 5A and 5B are schematic diagrams showing how radio waves radiated from an antenna AT equivalent to the test antenna 5 are transmitted to a wireless terminal 100A, for example. The wireless terminal 100A corresponds to the DUT 100. FIG. 5A shows an example of a case where radio waves are directly transmitted from the antenna AT to the wireless terminal 100A (Direct FAR Field), and FIG. 5B shows an example of a case where radio waves are transmitted from the antenna AT to the wireless terminal 100A through a reflecting mirror 7A having a paraboloid of revolution.

As shown in FIG. 5A, a radio wave having the antenna AT as a radiation source has a feature that the radio wave propagates while the wavefront spreads spherically with the radiation source at the center. In addition, it is known that a surface (wavefront) obtained by connecting the in-phase points of the waves is a curved spherical surface (spherical wave) at a short distance from the radiation source, but the wavefront becomes close to a plane (plane wave) as the distance from the radiation source increases. In general, a region where the wavefront needs to be considered as a spherical surface is called a near field (NEAR FIELD), and a region where the wavefront may be considered as a plane is called a far field (FAR FIELD). In the propagation of radio waves shown in FIG. 5A, it is preferable that the wireless terminal 100A receives a plane wave rather than receiving a spherical wave in order to perform satisfactory reception.

In order to receive a plane wave, the wireless terminal 100A needs to be provided so as to be present in the far field. Here, assuming that the maximum linear size of the wireless terminal 100A is D and the wavelength is $\lambda$, the far field is a distance of $2D^2/\lambda$ or more from the antenna AT. Specifically, in the case of D=0.4 m (meters) and wavelength $\lambda$=0.01 m (corresponding to a radio signal in a GHz band), the position of approximately 30 m from the antenna AT is a boundary between the near field and the far field, and it is necessary to place the wireless terminal 100A at a position farther from the boundary. In the present embodiment, measurement of the DUT 100 whose maximum linear size D is, for example, about 5 cm (centimeters) to about 33 cm is assumed.

Thus, the Direct Far Field method shown in FIG. 5A has a feature that the propagation distance between the antenna AT and the wireless terminal 100A is large and the propagation loss is large. Therefore, as a countermeasure, for example, as shown in FIG. 5B, there is a method in which the reflecting mirror 7A having a paraboloid of revolution is arranged at a position where the radio wave of the antenna AT can be reflected and introduced by the wireless terminal 100A. According to this method, not only can the distance between the antenna AT and the wireless terminal 100A be shortened, but also the region of the plane wave spreads from the distance immediately after reflection on the mirror surface of the reflecting mirror 7A. Therefore, the reduction effect of the propagation loss can also be expected. The propagation loss can be expressed by the phase difference between the waves in phase. The phase difference that can be allowed as a propagation loss is, for example, $\lambda/16$. The phase difference is assumed to be evaluated by, for example, a vector network analyzer (VNA).

Figure 6:
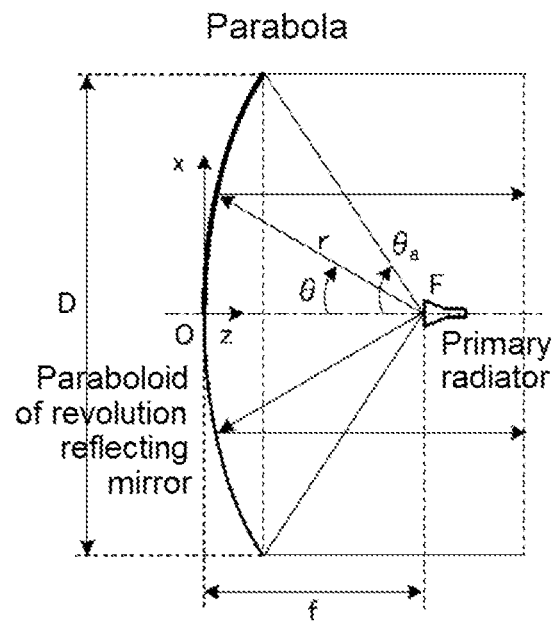
FIG. 6 is a schematic diagram showing the signal path structure of a parabola having the same paraboloid of revolution as a reflector adopted in an OTA chamber of the measurement apparatus according to the first embodiment of the present invention.

For example, a parabola (refer to FIG. 6) or an offset parabola (refer to FIG. 7) can be used as the reflecting mirror 7A shown in FIG. 5A. As shown in FIG. 6, the parabola has a mirror surface (paraboloid of revolution) that is symmetrical with respect to the axis passing through the antenna center O. By providing a primary radiator, which has directivity in the direction of the paraboloid of revolution, at the focal position F determined from the paraboloid of revolution, the parabola has a function of reflecting radio waves radiated from the primary radiator in a direction parallel to the axial direction. On the contrary, it can be understood that, by arranging, for example, the receiving antenna 6 according to the present embodiment at the focal position F, the parabola can reflect radio waves (for example, radio signal transmitted from the DUT 100) incident on the paraboloid of revolution in a direction parallel to the axial direction so that the radio waves are guided to the receiving antenna 6. However, since the planar shape of the parabola viewed from the front (Z direction) is a perfect circle, the structure is large. For this reason, the parabola is not suitable for being arranged as the reflector 7 of the OTA chamber 50.

Figure 7:
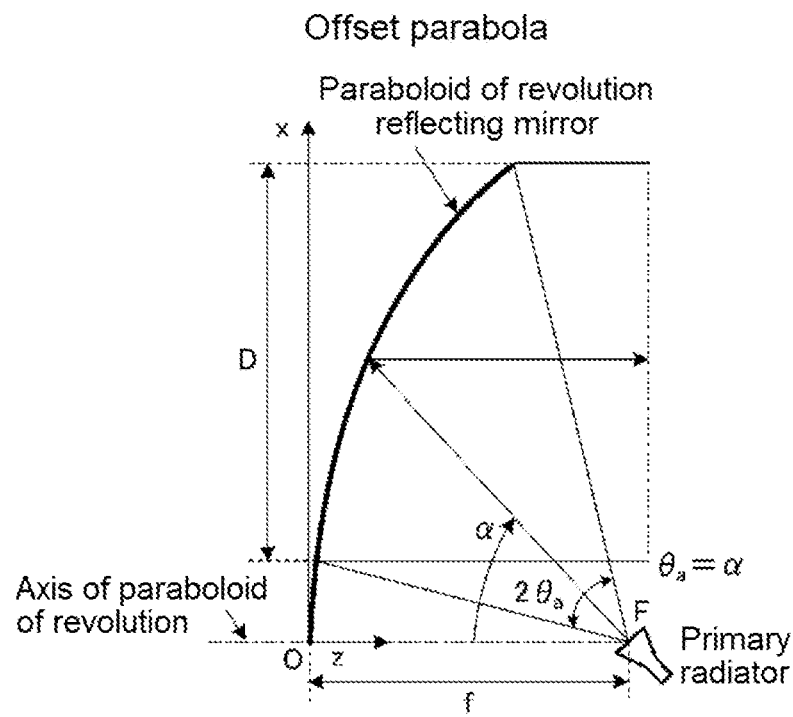
FIG. 7 is a schematic diagram showing the signal path structure of an offset parabola having the same paraboloid of revolution as a reflector adopted in an OTA chamber of the measurement apparatus according to the first embodiment of the present invention.

On the other hand, as shown in FIG. 7, the offset parabola has a mirror surface that is asymmetric with respect to the axis of the paraboloid of revolution (a shape obtained by cutting out a part of the paraboloid of revolution of the perfect circle type parabola (refer to FIG. 6)). By providing a primary radiator with its beam axis inclined at an angle $\alpha$, for example, with respect to the axis of the paraboloid of revolution, the offset parabola has a function of reflecting radio waves radiated from the primary radiator in a direction parallel to the axial direction of the paraboloid of revolution. It can be understood that, by placing, for example, the receiving antenna 6 according to the present embodiment at the focal position F, the offset parabola can reflect radio waves (for example, radio signal transmitted from the DUT 100) incident on the paraboloid of revolution in a direction parallel to the axial direction of the paraboloid of revolution so that the radio waves are guided to the receiving antenna 6. Since the offset parabola can be arranged such that the mirror surface is almost vertical, the structure is much smaller than the parabola (refer to FIG. 6).

Based on the findings described above, in the OTA chamber 50 according to the present embodiment, as shown in FIG. 1, the reflector 7 using the offset parabola (refer to FIG. 7) is arranged in the radio wave propagation path between the DUT 100 and the receiving antenna 6. The reflector 7 is attached to the side surface 52b of the housing main body 52 so that the position indicated by the reference numeral F in the diagram is the focal position.

The reflector 7 and one receiving antenna 6 held by the antenna holding mechanism 61 are in an offset state in which the beam axis BS1 of the receiving antenna 6 is inclined by a predetermined angle $\alpha$ with respect to the axis RS1 of the reflector 7. One receiving antenna 6 referred to herein is the receiving antenna 6 that can be viewed from the reflector 7 through an opening 67a of a cover unit 67 that covers the antenna holding mechanism 61.

The reflector 7 has the focal position F on the beam axis BS1 of the receiving antenna 6, and each receiving antenna 6 held by a rotating body 62 of the antenna holding mechanism 61 can sequentially pass through the position of one receiving antenna 6 whose visibility can be secured as described above, that is, the focal position F of the reflector 7. The inclination angle $\alpha$ described above can be set to, for example, 30°. In this case, the receiving antenna 6 is held by the antenna holding mechanism 61 so as to face the reflector 7 at an elevation angle of 30°, that is, so as to face the reflector 7 at an angle at which the receiving surface of the receiving antenna 6 is perpendicular to the beam axis of the radio signal. By adopting the offset parabola type reflector 7, the reflector 7 itself can be made small. Therefore, since it is possible to arrange the reflector 7 in such a posture that the mirror surface is almost vertical, there is a merit that the structure of the OTA chamber 50 can be reduced.

Next, the configuration of the automatic antenna arrangement means 60 for automatically arranging a plurality of receiving antennas 6 at the focal position F of the reflector 7 in a sequential manner will be described in detail.

The automatic antenna arrangement means 60 mounted in the OTA chamber 50 has the antenna holding mechanism 61, the power unit 64, the cover unit 67, and the automatic antenna arrangement control unit 16, for example, as shown in FIG. 1. The antenna holding mechanism 61 is formed by the rotating body 62 that can rotate around a rotary shaft 63. In the rotating body 62, for example, six receiving antennas 6 are arranged on the circumference around the rotary shaft 63. More specifically, in the rotating body 62, the six receiving antennas 6 are arranged at equal intervals along the outer periphery of the circle defining the circumference described above, that is, at intervals of 60° around the rotary shaft 63 on the horizontal plane. Here, the antenna holding mechanism 61 is provided in the internal space 51 so that the receiving surface of each receiving antenna 6, which moves (rotates) in the circumferential direction on the circumference by rotation of the rotating body 62, passes through the focal position F of the reflector 7.

The power unit 64 has a driving motor 65 for rotationally driving the rotating body 62 through the rotary shaft 63 and a connection member 66 such as a gear arranged between the driving motor 65 and the rotary shaft 63. The cover unit 67 covers the antenna holding mechanism 61 and the power unit 64 so that intrusion of radio waves from the outside and radiation of radio waves to the outside can be restricted.

The opening 67a is formed in the cover unit 67. The opening 67a is formed at a position, at which a view from the receiving antenna 6 with respect to the paraboloid of revolution of the reflector 7 can be secured, in a case where one of the receiving antennas 6 held by the antenna holding mechanism 61 is arranged at the focal position F of the reflector 7.

The automatic antenna arrangement control unit 16 drives the driving motor 65 based on a command from a control unit 11 (refer to FIG. 3) of the integrated control device 10 so that each receiving antenna 6 moves to the focal position F of the reflector 7 and stops in a sequential manner according to the divided frequency band shown in FIG. 8, for example.

Here, the functional configuration of the measurement apparatus 1 according to the present embodiment will be described in detail again with reference to FIGS. 2 to 4B. In the measurement apparatus 1 (refer to FIG. 2) according to the present embodiment, the integrated control device 10 has, for example, a functional configuration shown in FIG. 3, and the NR system simulator 20 and the signal analysis device 30 have, for example, functional configurations shown in FIGS. 4A and 4B. The NR system simulator 20 forms a simulation measurement device of the present invention.

Figure 3:
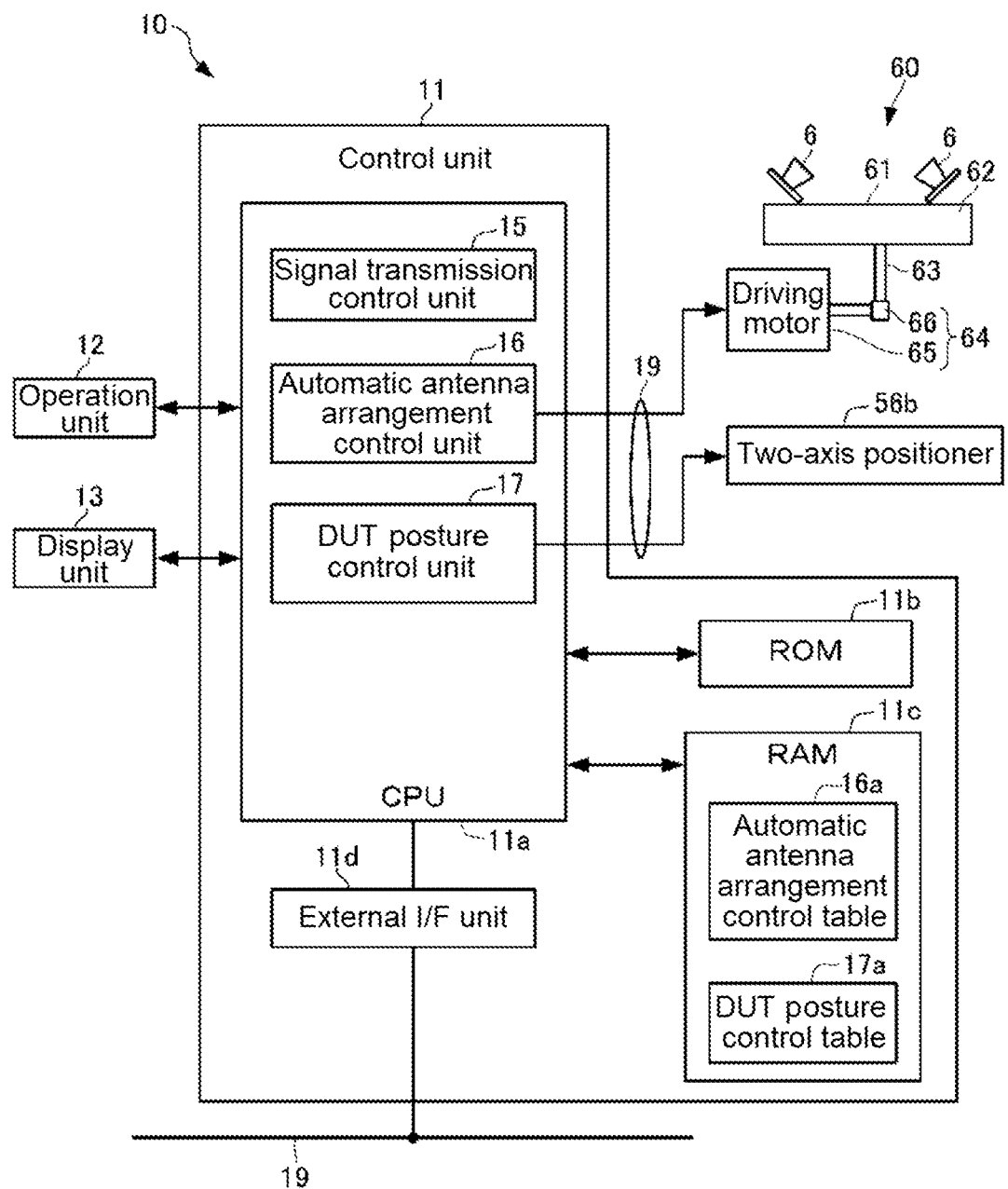
FIG. 3 is a block diagram showing the functional configuration of an integrated control device of the measurement apparatus according to the first embodiment of the present invention.

As shown in FIG. 3, the integrated control device 10 has the control unit 11, an operation unit 12, and a display unit 13. The control unit 11 is, for example, a computer apparatus. For example, as shown in FIG. 3, the computer apparatus has: a central processing unit (CPU) 11a that performs predetermined information processing for realizing the function of the measurement apparatus 1 or overall control of the NR system simulator 20 and the signal analysis device 30; a read only memory (ROM) 11b that stores an operating system (OS) for starting the CPU 11a or other programs, control parameters, and the like; a random access memory (RAM) 11c that stores the execution code, data, and the like of the OS or applications that the CPU 11a uses for operation; an external interface (I/F) unit 11d having an input interface function for receiving a predetermined signal and an output interface function for outputting a predetermined signal; a non-volatile storage medium such as a hard disk drive (not shown); and various input and output ports. The external I/F unit 11d is communicably connected to the NR system simulator 20 and the signal analysis device 30 through the network 19. In addition, the external I/F unit 11d is also connected to the driving motor 65 and a two-axis positioner 56a in the OTA chamber 50 through the network 19. The operation unit 12 and the display unit 13 are connected to the input and output ports. The operation unit 12 is a functional unit that inputs various kinds of information, such as commands, and the display unit 13 is a functional unit that displays various kinds of information, such as an input screen for the various kinds of information and measurement results.

The computer apparatus described above functions as a control unit 11 by the CPU 11a that executes a program stored in the ROM 11b using the RAM 11c as a work area. As shown in FIG. 3, the control unit 11 has a signal transmission control unit 15, the automatic antenna arrangement control unit 16, and the DUT posture control unit 17. The signal transmission control unit 15, the automatic antenna arrangement control unit 16, and the DUT posture control unit 17 are also realized by the CPU 11a that executes a predetermined program stored in the ROM 11b using the RAM 11c as a work area.

The signal transmission control unit 15 monitors a user operation in the operation unit 12, transmits a signal transmission command to the NR system simulator 20 in response to the user's operation to start predetermined spurious measurement, and performs control to transmit a test signal through the test antenna 5.

The automatic antenna arrangement control unit 16 performs control to automatically arrange the plurality of receiving antennas 6, which are held by the antenna holding mechanism 61 of the automatic antenna arrangement means 60, at the focal position F of the reflector 7 in a sequential manner. In order to realize this control, for example, an automatic antenna arrangement control table 16a is stored in the ROM 11b in advance. For example, in a case where a stepping motor is adopted as the driving motor 65, the automatic antenna arrangement control table 16a stores the number of driving pulses (the number of operation pulses) for determining the rotational driving of the stepping motor as control data. In the present embodiment, the automatic antenna arrangement control table 16a stores, as the control data, the number of operation pulses of the driving motor 65 for moving each receiving antenna 6 to the focal position F of the reflector 7 corresponding to, for example, each of the six divided frequency bands shown in FIG. 8.

The automatic antenna arrangement control unit 16 expands the automatic antenna arrangement control table 16a to the work area of the RAM 11c, and performs control for rotationally driving the driving motor 65 in the power unit 64 of the automatic antenna arrangement means 60 according to the divided frequency band corresponding to each receiving antenna 6 based on the automatic antenna arrangement control table 16a. By this control, it is possible to realize automatic antenna arrangement control to stop (arrange) each receiving antenna 6 at the focal position F of the reflector 7 in a sequential manner.

The DUT posture control unit 17 controls the posture of the DUT 100 held by the DUT holding unit 56 during measurement. In order to realize this control, for example, a DUT posture control table 17a is stored in the ROM 11b in advance. The DUT posture control table 17a stores, for example, control data of the two-axis positioner 56a that forms the DUT holding unit 56.

The DUT posture control unit 17 expands the DUT posture control table 17a to the work area of the RAM 11c, and controls the driving of the two-axis positioner 56a, based on the DUT posture control table 17a, to change the posture of the DUT 100 so that the antenna 110 is sequentially directed to all points on the surface of the sphere.

Figure 4A:
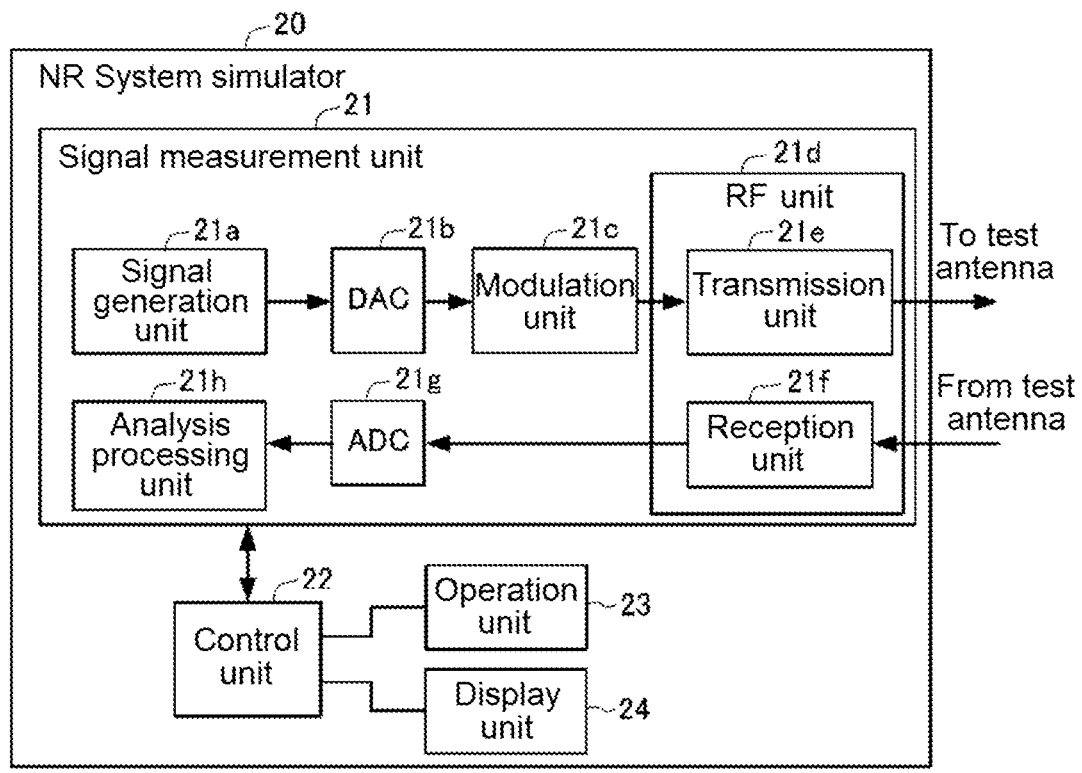
FIGS. 4A and 4B are block diagrams showing the functional configurations of an NR system simulator and a signal analysis device in the measurement apparatus according to the first embodiment of the present invention.
Figure 4B:
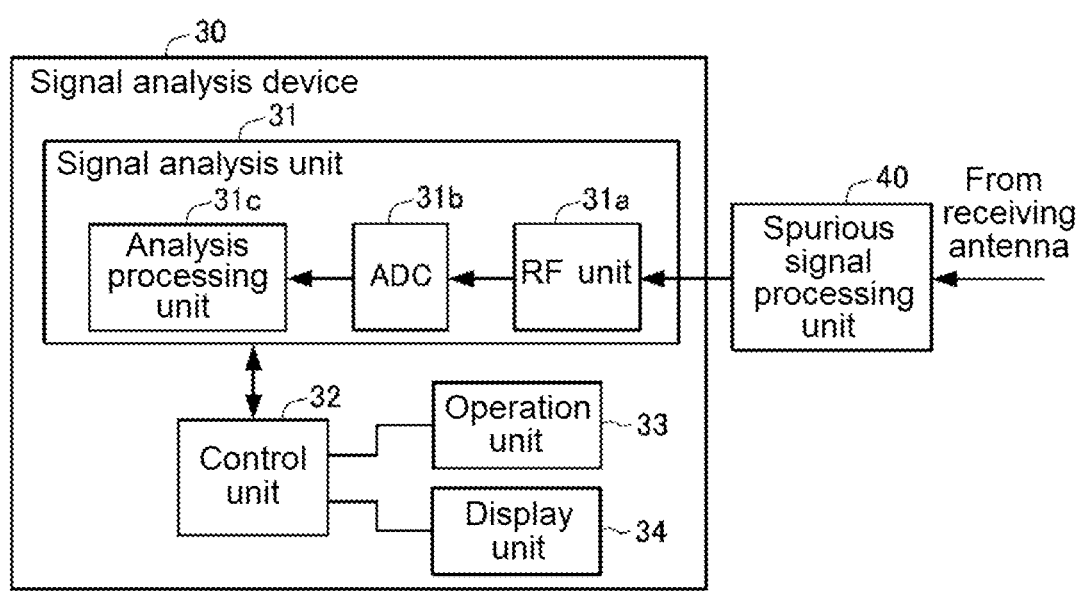

In the measurement apparatus 1 according to the present embodiment, the NR system simulator 20 has, for example, a functional configuration shown in FIG. 4A, and the signal analysis device 30 has, for example, a functional configuration shown in FIG. 4B.

As shown in FIG. 4A, the NR system simulator 20 has a signal measurement unit 21, a control unit 22, an operation unit 23, and a display unit 24. The signal measurement unit 21 has a signal generation function unit, which is formed by a signal generation unit 21a, a digital to analog converter (DAC) 21b, a modulation unit 21c, and a transmission unit 21e of an RF unit 21d, and a signal analysis function unit, which is formed by a reception unit 21f of the RF unit 21d, an analog/digital converter (ADC) 21g, and an analysis processing unit 21h.

In the signal generation function unit of the signal measurement unit 21, the signal generation unit 21a generates waveform data having a reference waveform, specifically, an I component baseband signal and a Q component baseband signal that is a quadrature component signal of the I component baseband signal, for example. The DAC 21b converts the waveform data (the I component baseband signal and the Q component baseband signal) having a reference waveform output from the signal generation unit 21a from a digital signal to an analog signal, and outputs the analog signal to the modulation unit 21c. The modulation unit 21c mixes each of the I component baseband signal and the Q component baseband signal with a local signal, and performs modulation processing for combining both the signals and outputting the result as a frequency of digital modulation. The RF unit 21d generates a test signal in which the frequency of digital modulation output from the modulation unit 21c corresponds to the frequency of each communication standard, and the generated test signal is output to the DUT 100 by the transmission unit 21e.

In the signal analysis function unit of the signal measurement unit 21, the RF unit 21d receives a measurement target signal, which is transmitted from the DUT 100 that has received the above-described test signal through the antenna 110, using the reception unit 21f and then mixes the measurement target signal with a local signal to perform conversion into an intermediate frequency band (IF signal). The ADC 21g converts the measurement target signal, which has been converted into the IF signal by the reception unit 21f of the RF unit 21d, from an analog signal to a digital signal, and outputs the digital signal to the analysis processing unit 21h.

The analysis processing unit 21h generates waveform data corresponding to the I component baseband signal and the Q component baseband signal by performing digital processing on the measurement target signal output from the ADC 21g, and then performs processing for analyzing the I component baseband signal and the Q component baseband signal based on the waveform data.

Similarly to the control unit 11 of the integrated control device 10 described above, the control unit 22 is, for example, a computer apparatus including a CPU, a RAM, a ROM, and various input and output interfaces. The CPU performs predetermined information processing and control for realizing each function of the signal generation function unit, the signal analysis function unit, the operation unit 23, and the display unit 24.

The operation unit 23 and the display unit 24 are connected to the input and output interfaces of the computer apparatus described above. The operation unit 23 is a functional unit that inputs various kinds of information, such as commands, and the display unit 24 is a functional unit that displays various kinds of information, such as an input screen for the various kinds of information and measurement results.

As shown in FIG. 4B, the signal analysis device 30 has a signal analysis unit 31, a control unit 32, an operation unit 33, and a display unit 34. The signal analysis unit 31 has an RF unit 31a, an ADC 31b, and an analysis processing unit 31c, and performs the same analysis processing as that of the signal analysis function unit of the NR system simulator 20 on the spurious signal input from the spurious signal processing unit 40. The spurious signal processing unit 40 has a down converter, an amplifier, and a frequency filter. The spurious signal processing unit 40 performs each processing of frequency conversion, amplification, and frequency selection on the radio signal (spurious signal) of each divided frequency band received by each receiving antenna 6, and then transmits the radio signal to the RF unit 31a of the signal analysis unit 31. The signal analysis device 30 may be configured to include the spurious signal processing unit 40.

Figure 9:
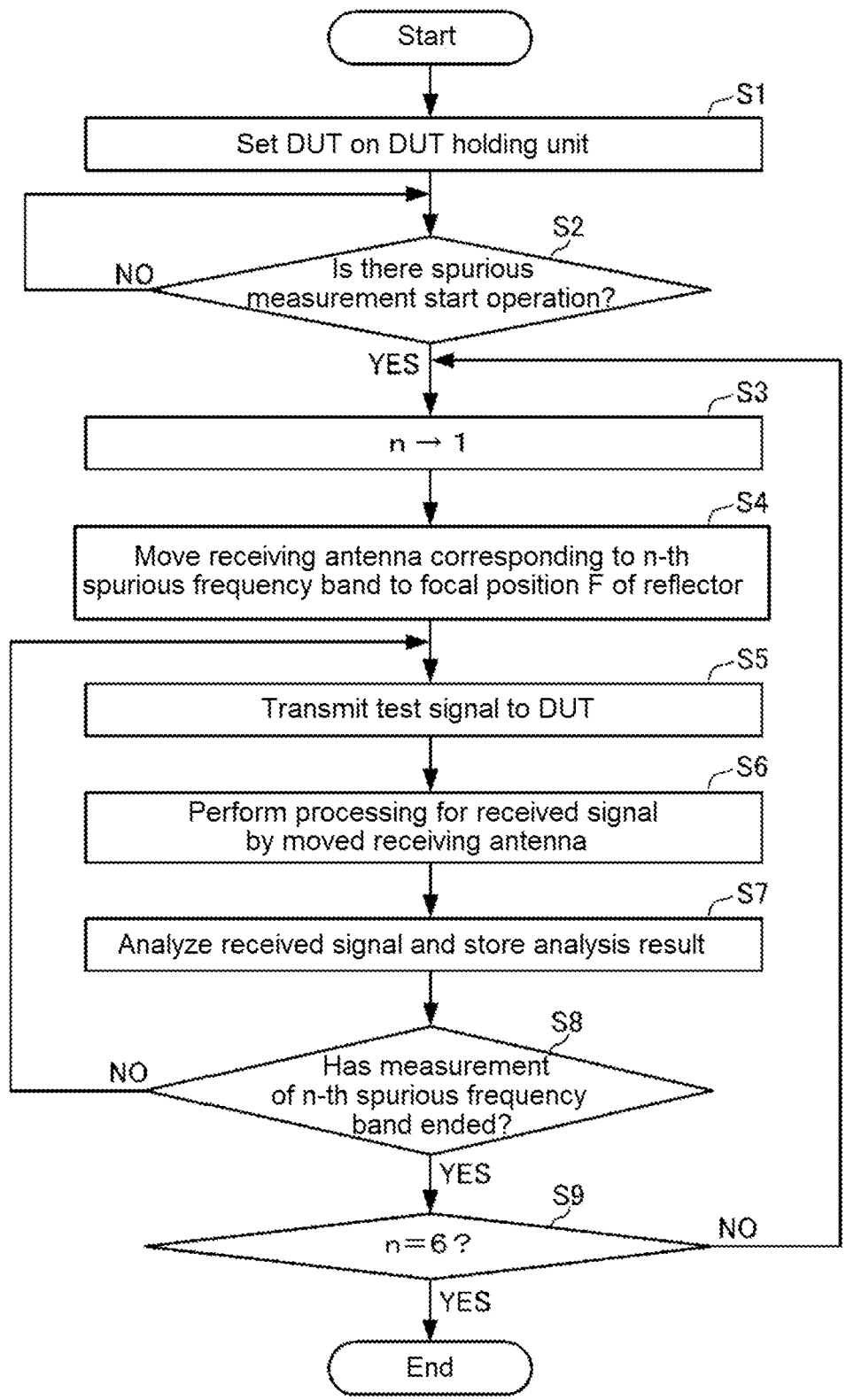
FIG. 9 is a flowchart showing a spurious measurement process on a device under test in the measurement apparatus according to the first embodiment of the present invention.

Next, spurious measurement processing in the measurement apparatus 1 according to the present embodiment will be described with reference to FIG. 9. In FIG. 9, an example will be described in which the antenna holding mechanism 61 of the automatic antenna arrangement means 60 holds six receiving antennas 6 corresponding to different divided frequency bands of the spurious frequency band so as to be automatically arranged at the focal position F of the reflector 7. In addition, in FIG. 9, a case will be described in which a spurious measurement start operation for giving an instruction to start spurious measurement is performed by the operation unit 12 of the integrated control device 10. The spurious measurement start operation may also be performed by the operation unit 33 of the signal analysis device 30.

In the measurement apparatus 1, in order to perform spurious measurement, the DUT 100 needs to be set in the internal space 51 of the OTA chamber 50 first. Therefore, in the measurement apparatus 1, a work for setting the DUT 100 to be tested on the DUT mounting unit 56c of the DUT holding unit 56 of the OTA chamber 50 is performed as the first processing for spurious measurement by the user (step S1). In this case, for the automatic antenna arrangement means 60, a number of receiving antennas 6 (in this example, six receiving antennas 6), by which the spurious measurement frequency band to be measured can be covered, need to be held by the antenna holding mechanism 61, and the antenna holding mechanism 61 needs to be provided at a position where each receiving antenna 6 can pass through the focal position F (refer to FIG. 7) of the reflector 7 in a sequential manner.

After the work for setting the DUT 100 is performed, for example, the automatic antenna arrangement control unit in the integrated control device 10 monitors whether or not a spurious measurement start operation has been performed through the operation unit 12 (step S2).

Here, in a case where it is determined that the spurious measurement start operation has not been performed (NO in step S2), the automatic antenna arrangement control unit 16 continues monitoring in step S1 described above. On the other hand, in a case where it is determined that the spurious measurement start operation has been performed (YES in step S2), the automatic antenna arrangement control unit sets n indicating the measurement order of the spurious measurement frequency band to n=1 indicating the first frequency band (step S3). In this example, the maximum value of n is 6.

Then, the automatic antenna arrangement control unit 16 performs control to automatically move (arrange) the receiving antenna 6, which corresponds to the first divided frequency band corresponding to n=1, to the focal position F of the reflector 7 (step S4). In this case, the automatic antenna arrangement control unit 16 reads the number of operation pulses of the receiving antenna 6 corresponding to the first divided frequency band corresponding to n=1 from the automatic antenna arrangement control table 16a, and controls the rotation of the driving motor 65 based on the number of operation pulses.

After the execution of the automatic arrangement control of the receiving antenna 6 in step S4, the signal transmission control unit 15 transmits a signal transmission command to the NR system simulator 20. The NR system simulator 20 performs control to transmit a test signal to the DUT 100 through the test antenna 5 based on the signal transmission command (step S5).

The test signal transmission control herein is performed as follows by the NR system simulator 20. In the NR system simulator 20 (refer to FIG. 4A), the control unit 22 that has received the above-described signal transmission command controls the signal generation function unit to generate a signal for generating a test signal in the signal generation unit 21a. Thereafter, this signal is subjected to digital/analog conversion processing by the DAC 21b and subjected to modulation processing by the modulation unit 21c. Then, the RF unit 21d generates a test signal in which the digitally modulated frequency corresponds to the frequency of each communication standard, and the transmission unit 21e outputs the test signal to the DUT 100 through the test antenna 5. After starting the control of the test signal transmission in step S5, the signal transmission control unit 15 performs control to continue the transmission of the test signal until the spurious measurement in the receiving antenna 6 corresponding to all the divided frequency bands of the spurious frequency band to be measured ends. In addition, during this period of time, in the integrated control device 10, the DUT posture control unit 17 continues to control the two-axis positioner 56a so that the DUT 100 mounted on the DUT mounting unit 56c has the above-described posture.

After the transmission of the test signal is started in step S5, the signal analysis device 30 performs processing for receiving the signal in the spurious frequency band received by the receiving antenna 6 automatically arranged at the focal position F of the reflector 7 in step S4 (step S6). In this reception processing, the signal received by the receiving antenna 6 automatically arranged is input to the spurious signal processing unit 40, and is input to the signal analysis unit 31 of the signal analysis device 30 after each processing of frequency conversion, amplification, and frequency selection is performed by the spurious signal processing unit 40.

Then, the signal analysis device 30 analyzes the signal input from the spurious signal processing unit 40 (signal received by the receiving antenna 6), and performs control to store the analysis result (step S7). In this case, in the signal analysis device 30, the control unit 32 controls the signal analysis unit 31, so that the reception signal input from the spurious signal processing unit 40 is acquired through the RF unit 31a and the ADC 31b and the analysis processing unit 31c performs control to analyze, for example, a frequency band and power for the reception signal. In addition, the control unit 32 performs control to store the analysis result of the reception signal in a storage region, such as a RAM (not shown).

Then, in the integrated control device 10, for example, the automatic antenna arrangement control unit 16 determines whether or not the spurious measurement of the first divided frequency band corresponding to n=1 has ended (step S8). Here, in a case where it is determined that the spurious measurement of the first divided frequency band has not ended (NO in step S8), processing from step S5 is continued.

On the other hand, in a case where it is determined that the spurious measurement of the first divided frequency band has ended (YES in step S8), the automatic antenna arrangement control unit 16 determines whether or not n has reached n=6 indicating the last divided frequency band (step S9). Here, in a case where it is determined that n has not reached n=6 (NO in step S9), the automatic antenna arrangement control unit 16 proceeds to step S3 to set n to n=2 indicating the second frequency band (step S3).

Therefore, using the method described in step S2 at the time of n=1, the automatic antenna arrangement control unit performs control to automatically move the receiving antenna 6, which corresponds to the second divided frequency band corresponding to n=2, to the focal position F of the reflector 7 (step S4). Thereafter, the integrated control device 10 also performs the processing of S5 to S9, which has been performed on the signal received by the receiving antenna 6 corresponding to the first divided frequency band corresponding to n=1, on the signal received by the receiving antenna 6 corresponding to the second divided frequency band corresponding to n=2. In this example, the integrated control device 10 performs the processing of S5 to S9 on the signals received by the respective receiving antennas 6 corresponding to the first to sixth divided frequency bands corresponding to n=3 to 6 after setting to n=2.

During this period of time, in a case where it is determined that n has reached n=6 in step S9 (YES in step S9), the automatic antenna arrangement control unit 16 ends the series of spurious measurement processing shown in FIG. 9.

In the measurement apparatus 1 according to the present embodiment, after transmitting the test signal from the NR system simulator 20 in step S5, the control unit 22 in the NR system simulator 20 may perform control such that the DUT 100 that has received the test signal measures the measurement target signal transmitted from the antenna 110. At the time of this control, the measurement target signal received through the test antenna 5 is input to the reception unit 21f of the RF unit 21d in the NR system simulator 20 (refer to FIG. 4A). In the NR system simulator 20, the control unit 22 controls the signal generation function unit to convert the measurement target signal input to the reception unit 21f of the RF unit 21d into an IF signal first. Then, the analog signal is converted into a digital signal by the ADC 21g and input to the analysis processing unit 21h, and the analysis processing unit 21h generates waveform data corresponding to the I component baseband signal and the Q component baseband signal and performs processing for analyzing the I component baseband signal and the Q component baseband signal based on the waveform data. It is needless to say that the measurement processing of the test signal described above by the NR system simulator 20 can be performed at any timing independently of the spurious measurement processing shown in FIG. 9.

As described above, the measurement apparatus (antenna apparatus) 1 according to the present embodiment includes: an anechoic box 50 having the internal space 51 that is not influenced by the surrounding radio wave environment; a plurality of receiving antennas 6 that use radio signals in a plurality of divided frequency bands set in advance; the reflector 7 that is housed in the internal space and has a predetermined paraboloid of revolution, radio signals transmitted or received by the antenna 110 of the DUT 100 being reflected through the paraboloid of revolution; and the automatic antenna arrangement means 60 for automatically arranging the plurality of receiving antennas 6 at the focal position F, which is determined from the paraboloid of revolution, in a sequential manner according to the divided frequency band.

With this configuration, in the measurement apparatus 1 according to the present embodiment, the user does not need to perform a work for sequential replacement of the receiving antenna 6 at the focal position F of the reflector 7 during spurious measurement using the OTA chamber 50. In addition, since the automatic antenna arrangement means 60 is added after shortening the signal propagation path by providing the reflector 7, this is not a major obstacle for the OTA chamber to be made compact. In addition, since each receiving antenna 6 can be automatically arranged, spurious measurement in each divided frequency band can be performed without interruption. Therefore, the efficiency of the measurement processing can be improved.

In the measurement apparatus 1 according to the present embodiment, the antenna 110 of the DUT 100 uses a radio signal in a specified frequency band, and the divided frequency band is a partial frequency band of a predetermined spurious frequency band (refer to FIG. 8) from a frequency band lower than the specified frequency band to a frequency band higher than the specified frequency band. The anechoic box 50 further includes: the test antenna 5 that uses a radio signal in a specified frequency band; the NR system simulator 20 that outputs a test signal to the DUT 100 through the test antenna 5, receives a measurement target signal output from the DUT 100, to which the test signal has been input, through the test antenna 5, and measures a radio signal in a specified frequency band based on the received measurement target signal; and the signal analysis device 30 that receives a radio signal in a spurious frequency band, which is output together with the measurement target signal from the DUT 100 to which the test signal has been input, through each receiving antenna 6 corresponding to each divided frequency band and analyzes the frequency distribution and power of the received radio signal in the spurious frequency band.

With this configuration, for the DUT 100 having the antenna 110 that uses a radio signal in a specified frequency band, the measurement apparatus according to the present embodiment can easily measure a spurious signal, which is radiated from the DUT 100, in a predetermined spurious frequency band from a frequency band lower than the specified frequency band to a frequency band higher than the specified frequency band.

In the measurement apparatus 1 according to the present embodiment, the automatic antenna arrangement means 60 is configured to include: the antenna holding mechanism 61 in which each receiving antenna 6 is arranged on the circumference around the rotary shaft 63 in the rotating body 62 that can rotate around the rotary shaft 63 and which is provided in the internal space 51 of the OTA chamber 50 so that the receiving surface of each receiving antenna 6 passes through the focal position F of the reflector 7 by rotation of the rotating body 62; the power unit 64 having the driving motor 65 for rotationally driving the rotating body 62 through the rotary shaft 63; and the automatic antenna arrangement control unit 16 that controls the driving motor 65 so that each receiving antenna 6 is sequentially stopped at the focal position F according to the divided frequency band.

With this configuration, since the measurement apparatus 1 according to the present embodiment adopts the antenna holding mechanism 61 in which each receiving antenna 6 is arranged on the circumference around the rotary shaft 63, it is possible to reduce the installation space of the antenna holding mechanism 61 while keeping the OTA chamber 50 compact.

In the measurement apparatus 1 according to the present embodiment, the antenna holding mechanism 61 is provided on the bottom surface 52a of the internal space 51 of the OTA chamber 50, and is formed by the rotating body 62 that can rotate along a plane in the horizontal direction by the rotary shaft 63 along the vertical direction. With this configuration, in the measurement apparatus 1 according to the present embodiment, a space horizontal to the bottom surface 52a of the internal space 51 of the OTA chamber 50 is secured as an installation space of the antenna holding mechanism 61. Therefore, it is possible to prevent an increase in the height of the OTA chamber 50.

In the measurement apparatus 1 according to the present embodiment, the antenna holding mechanism 61 holds each receiving antenna 6 so that the receiving surface of the receiving antenna 6 is directed to the rotary shaft 63 side. With this configuration, in the measurement apparatus 1 according to the present embodiment, the antenna holding mechanism 61 is arranged at the central portion of the bottom surface 52a of the internal space 51 of the OTA chamber 50. Therefore, since the diameter of the circumference on which each receiving antenna 6 is arranged can be reduced, it is possible to keep the antenna holding mechanism 61 and the OTA chamber 50 compact.

In the measurement apparatus 1 according to the present embodiment, in a case where the receiving antenna 6 is stopped at the focal position F of the reflector 7, the antenna holding mechanism 61 holds the receiving antenna 6 so as to face the reflector 7 at an angle at which the receiving surface of the receiving antenna 6 is perpendicular to the beam axis of the radio signal, for example, at an elevation angle of 30°. With this configuration, in the measurement apparatus 1 according to the present embodiment, it is possible to improve the reception accuracy of the receiving antenna 6 arranged at the focal position F of the reflector 7 and improve the spurious measurement accuracy.

The measurement method according to the present embodiment is a measurement method using the measurement apparatus 1 having the configuration described above, and includes: a holding step of holding the DUT 100 in the DUT holding unit 56 in the internal space 51 of the OTA chamber (step S1 in FIG. 9); an automatic antenna arrangement step of automatically arranging a plurality of receiving antennas 6 at the focal position F of the reflector 7 in a sequential manner according to the divided frequency band based on a predetermined spurious measurement start command (steps S3 and S4 in FIG. 9); a test signal output step of causing the NR system simulator 20 to output a test signal to the DUT 100 through the test antenna 5 (step S5 in FIG. 9); a signal receiving step of receiving a radio signal in a spurious frequency band, which is output together with a measurement target signal from the DUT 100 to which the test signal has been input, through each receiving antenna 6 corresponding to each divided frequency band (step S6 in FIG. 9); and an analysis step of analyzing the frequency distribution and power of the radio signal in the spurious frequency band received in the signal receiving step (step S7 in FIG. 9).

With this configuration, in the measurement method according to the present embodiment, since the measurement apparatus 1 having the OTA chamber 50 in which the automatic antenna arrangement means 60 is provided is used, the user does not need to perform a work for sequential replacement of the receiving antenna 6 at the focal position F of the reflector 7 during spurious measurement. In addition, since each receiving antenna 6 is automatically arranged, spurious measurement in each divided frequency band can be performed without interruption. Therefore, the efficiency of the measurement processing can be improved.

Second Embodiment

Figure 10:
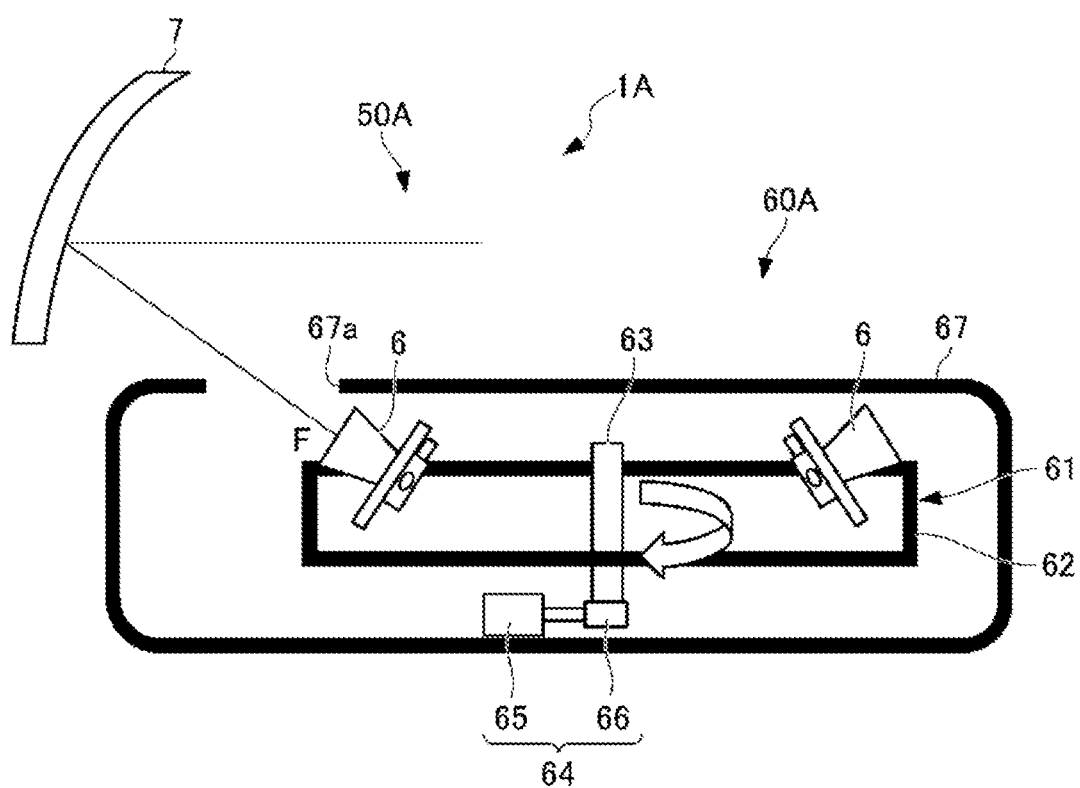
FIG. 10 is a side view showing the schematic configuration of automatic antenna arrangement means adopted in an OTA chamber of a measurement apparatus according to a second embodiment of the present invention.

As shown in FIG. 10, in a measurement apparatus 1A according to a second embodiment of the present invention, an OTA chamber 50A adopting automatic antenna arrangement means 60A is used instead of the OTA chamber 50 used in the measurement apparatus 1 according to the first embodiment. In the automatic antenna arrangement means 60A, the same components as the automatic antenna arrangement means 60 (refer to FIGS. 1 and 2) mounted in the OTA chamber 50 according to the first embodiment are denoted by the same reference numerals.

As shown in FIG. 10, similarly to the automatic antenna arrangement means 60 according to the first embodiment, the automatic antenna arrangement means 60A according to the present embodiment has: an antenna holding mechanism 61 in which each receiving antenna 6 is arranged on the circumference around a rotary shaft 63 in a rotating body 62 that can rotate around the rotary shaft 63 and which is provided in the internal space of the OTA chamber 50A so that the receiving surface of each receiving antenna 6 passes through the focal position F of a reflector 7 by rotation of the rotating body 62; and a power unit 64 having a driving motor 65 for rotationally driving the rotating body 62 through the rotary shaft 63. That is, also in the automatic antenna arrangement means 60A according to the present embodiment, the antenna holding mechanism 61 is provided on the bottom surface of the internal space 51 of the OTA chamber 50A, and is formed by the rotating body 62 that can rotate along a plane in the horizontal direction by the rotary shaft 63 along the vertical direction.

The automatic antenna arrangement means 60A according to the present embodiment has the same configuration as the automatic antenna arrangement means 60 according to the first embodiment except for the arrangement of the receiving antenna 6 with respect to the rotating body 62. In the automatic antenna arrangement means 60 according to the first embodiment, the antenna holding mechanism 61 holds each receiving antenna 6 so that the receiving surface of each receiving antenna 6 is directed to the rotary shaft 63 side (inner side) (refer to FIG. 1). In contrast, in the automatic antenna arrangement means 60A according to the present embodiment, as shown in FIG. 10, the antenna holding mechanism 61 holds each receiving antenna 6 so that the receiving surface of each receiving antenna 6 is directed to the opposite side (outer side) to the rotary shaft 63 side.

Also in the automatic antenna arrangement means 60A according to the present embodiment, the driving motor 65 forming the power unit 64 is connected to the automatic antenna arrangement control unit 16. In addition, also in the present embodiment, the automatic antenna arrangement control table 16a is prepared in advance in which the number of operation pulses (here, a value different from that in the first embodiment) that can be arranged at the focal position F of the reflector 7 corresponding to each receiving antenna 6 is stored. Therefore, also in the measurement apparatus 1A according to the present embodiment, as in the first embodiment, the automatic antenna arrangement control unit 16 reads the number of operation pulses of each receiving antenna 6 from the automatic antenna arrangement control table 16a and controls the rotation of the driving motor 65 based on the number of pulses, along the flowchart shown in FIG. 9, so that each receiving antenna 6 can be sequentially arranged at the focal position F of the reflector 7 (refer to step S4 in FIG. 9).

In the measurement apparatus (antenna apparatus) 1A according to the present embodiment, the automatic antenna arrangement means 60A for automatically arranging the receiving antenna 6 at the focal position F of the reflector in a sequential manner. Therefore, as in the first embodiment, it is possible to easily perform the spurious measurement without forcing the user to perform a work for replacement of the plurality of receiving antennas 6. In particular, according to the configuration of the OTA chamber 50A having the automatic antenna arrangement means 60A according to the present embodiment, for example, the antenna holding mechanism 61A is arranged at a position avoiding the central portion of the bottom surface 52a of the internal space 51. Therefore, the diameter of the circumference on which the receiving antenna 6 is arranged is reduced. This is useful for making the antenna holding mechanism 61A small.

Third Embodiment

Figure 11A:
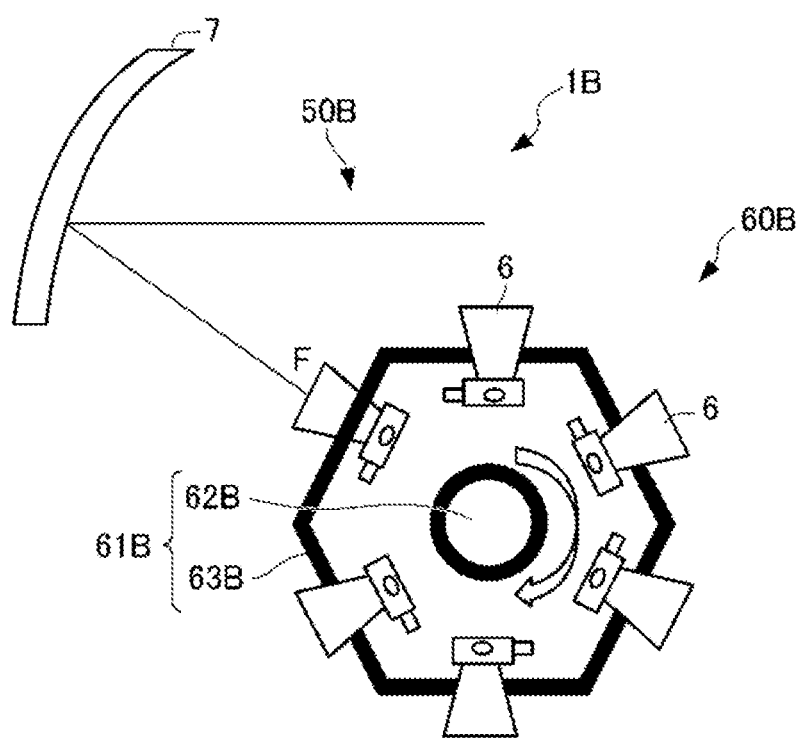
FIGS. 11A and 11B are schematic configuration diagrams of automatic antenna arrangement means adopted in an OTA chamber of a measurement apparatus according to a third embodiment of the present invention.
Figure 11B:
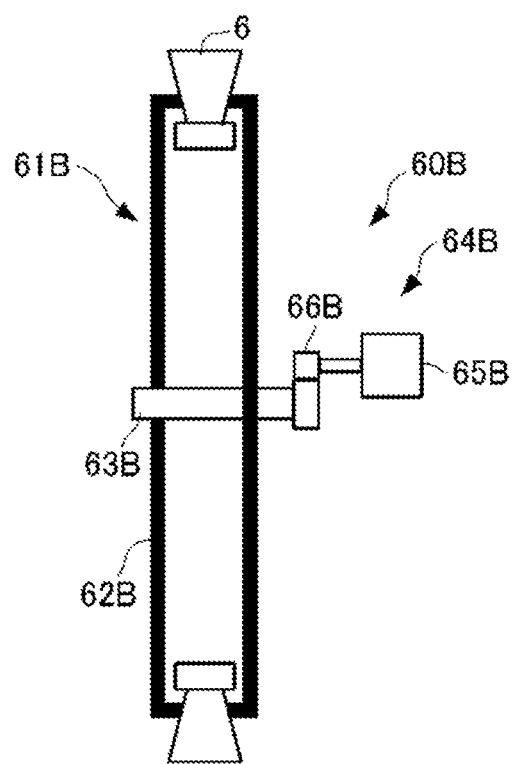

As shown in FIGS. 11A and 11B, in a measurement apparatus 1B according to a third embodiment of the present invention, an OTA chamber 50B adopting automatic antenna arrangement means 60B is used instead of the OTA chambers 50 and 50A used in the measurement apparatuses 1 and 1A according to the first and second embodiments. FIG. 11A shows a schematic configuration viewed from the front of the automatic antenna arrangement means 60B, and FIG. 11B shows a schematic configuration of the automatic antenna arrangement means 60B viewed from the right side of FIG. 11A.

The automatic antenna arrangement means 60 and 60A of the measurement apparatuses 1 and 1A according to the first and second embodiments has the antenna holding mechanism 61 that holds a plurality of receiving antennas 6 on the circumference of the rotating body 62 that can rotate on the horizontal plane through the rotary shaft 63 perpendicular to the horizontal plane. In contrast, as shown in FIGS. 11A and 11B, the automatic antenna arrangement means 60B according to the present embodiment has an antenna holding mechanism 61B that holds a plurality of receiving antennas 6 on the circumference along the outer periphery of a rotating body 62B that can rotate along a plane in the vertical direction through a rotary shaft 63B extending in the horizontal direction. A power unit 64B of the automatic antenna arrangement means 60B is formed by the same driving motor 65B as the driving motor 65 according to the first and second embodiments and a connection member 66B interposed between the driving motor 65B and the rotary shaft 63B of the rotating body 62B.

The automatic antenna arrangement means 60B according to the present embodiment is different from the first and second embodiments in that the plurality of receiving antennas 6 held by the antenna holding mechanism 61B rotate along the plane in the vertical direction with rotation of the rotating body 62B. However, the automatic antenna arrangement means 60B according to the present embodiment is the same as the first and second embodiments in that the movement of each receiving antenna 6 to a predetermined position on the circumference, in particular, the focal position F of the reflector 7 can be controlled by the amount of rotation of the driving motor 65B, that is, the number of operation pulses applied to the driving motor 65B.

Therefore, also in the present embodiment, the automatic antenna arrangement control table 16a is prepared in advance in which the number of operation pulses (here, a value different from those in the first and second embodiments) that can be arranged at the focal position F of the reflector 7 corresponding to each receiving antenna 6 is stored. Then, in the automatic antenna arrangement control unit 16 to which the driving motor 65B forming the power unit 64B of the automatic antenna arrangement means 60B is connected, driving control of the driving motor 65B is performed based on the automatic antenna arrangement control table 16a. In this case, the automatic antenna arrangement control unit 16 reads the number of operation pulses of each receiving antenna 6 from the automatic antenna arrangement control table 16a and controls the rotation of the driving motor 65B based on the number of pulses, so that each receiving antenna 6 can be sequentially arranged at the focal position F of the reflector 7 (refer to step S4 in FIG. 9).

In the measurement apparatus (antenna apparatus) 1B according to the present embodiment, the automatic antenna arrangement means 60B for automatically arranging the receiving antenna 6 at the focal position F of the reflector in a sequential manner. Therefore, as in the first embodiment, it is possible to easily perform the spurious measurement without forcing the user to perform a work for replacement of the plurality of receiving antennas 6. In particular, according to the configuration of the OTA chamber 50B having the automatic antenna arrangement means 60B according to the present embodiment, a space perpendicular to the bottom surface 52a of the internal space 51 is secured as an installation space of the antenna holding mechanism 61B. Therefore, it is possible to prevent an increase in the width of the housing main body 52.

Fourth Embodiment

Figure 12:
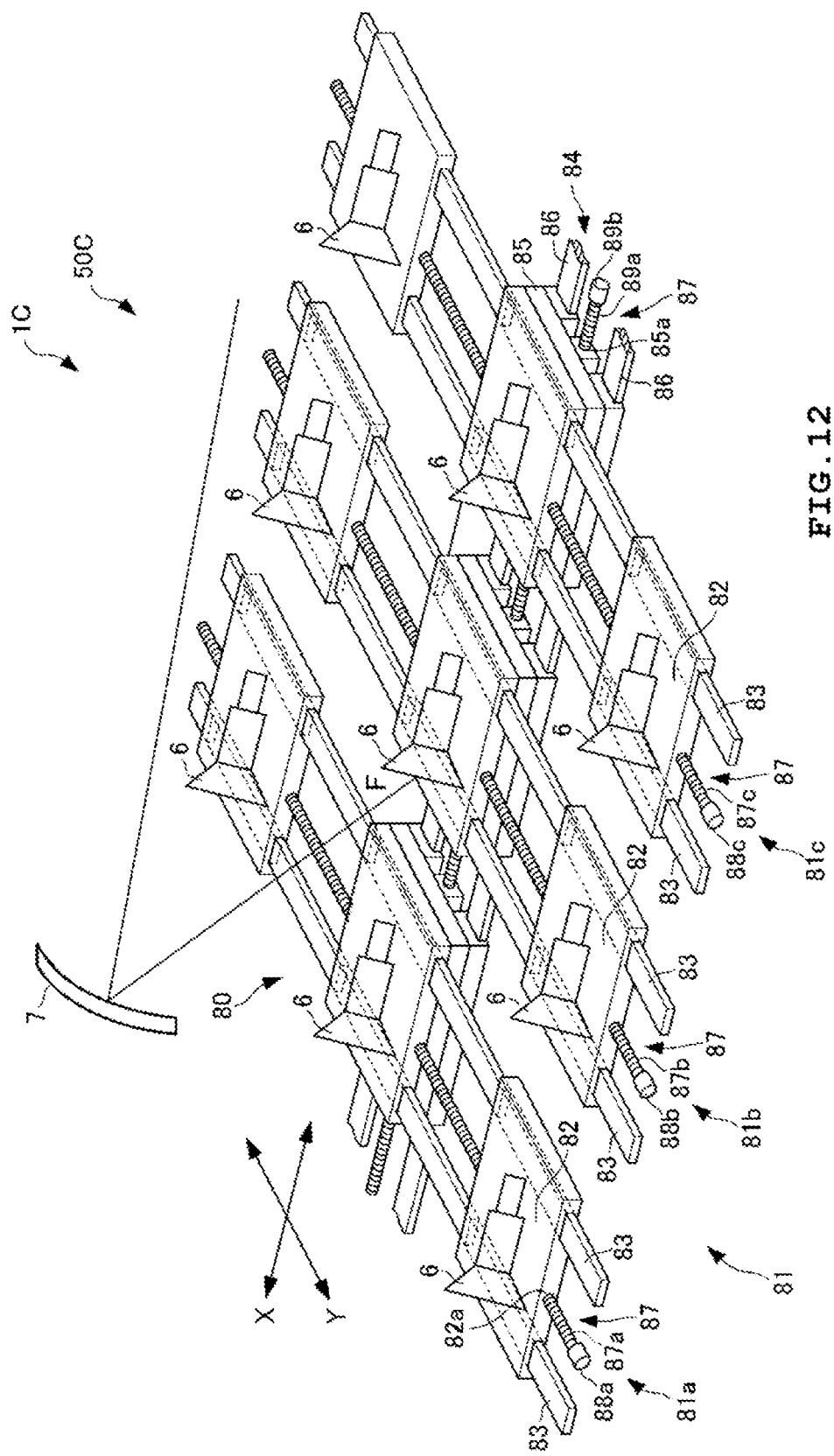
FIG. 12 is a perspective view showing the schematic configuration of automatic antenna arrangement means adopted in an OTA chamber of a measurement apparatus according to a fourth embodiment of the present invention.

As shown in FIG. 12, in a measurement apparatus 1C according to a fourth embodiment of the present invention, an OTA chamber 50C adopting automatic antenna arrangement means is used instead of the OTA chamber 50 used in the measurement apparatus 1 according to the first embodiment.

As shown in FIG. 12, the automatic antenna arrangement means 80 according to the present embodiment has an antenna holding mechanism 81 and a power unit 87. The antenna holding mechanism 81 is formed by a plurality of first slide mechanisms 81a, 81b, and 81c and a second slide mechanism 84 arranged perpendicular to the first slide mechanisms 81a, 81b, and 81c. Each of the first slide mechanisms 81a, 81b, and 81c has a plurality of antenna pedestals 82, and is configured to hold the antenna pedestals 82 so as to be slidable in one direction while maintaining a predetermined interval along a pair of guide rails 83, for example. Here, the one direction is, for example, a Y axis direction on a plane formed by an X axis and a Y axis perpendicular to each other. The receiving antenna 6 is attached to each of the antenna pedestals 82.

On the other hand, the second slide mechanism 84 has a pedestal portion 85 on which the first slide mechanisms 81a, 81b, and 81c are mounted, and holds the first slide mechanisms 81a, 81b, and 81c so as to be slidable in the other direction perpendicular to the Y axis direction along a pair of guide rails 86, for example.

The power unit 87 has driving shafts 87a, 87b, and 87c, which are provided along the Y axis direction so as to pass through a through hole 82a of the antenna pedestal 82 forming each of the first slide mechanisms 81a, 81b, and 81c, and first driving motors 88a, 88b, and 88c for rotationally driving the driving shafts 87a, 87b, and 87c. In addition, the power unit 87 has a driving shaft 89a, which is provided along the X axis direction so as to pass through a through hole 85a of the pedestal portion 85 forming the second slide mechanism 84, and a second driving motor 89b for rotationally driving the driving shafts 89a. In the through hole 82a of each antenna pedestal 82 described above and the through hole 85a of each pedestal portion 85, screws fitted to screws formed on the driving shafts 87a, 87b, and 87c and the driving shaft 89a are formed. Therefore, the power unit 87 can move each antenna pedestal 82 in both directions corresponding to the forward and reverse rotation directions along the Y axis by rotationally driving the first driving motors 88a, 88b, and 88c in both forward and reverse directions to rotationally drive the driving shafts 87a, 87b, and 87c in the same direction. Similarly, it is possible to move each pedestal portion 85 in both directions corresponding to the forward and reverse rotation directions along the X axis by rotationally driving the second driving motor 89b in both forward and reverse directions to rotationally drive the driving shaft 89a in the same direction.

In the automatic antenna arrangement means 80 shown in FIG. 12, the antenna holding mechanism 81 is provided on, for example, the bottom surface 52a in the internal space 51 of the OTA chamber 50C so that each receiving antenna 6 mounted on each antenna pedestal 82 can pass through the focal position F of the reflector 7. In the configuration shown in FIG. 12, the focal position F of the reflector 7 can be expressed by the coordinates on the XY plane. The amount of movement of the pedestal portion 85 in the X axis direction corresponds to the number of operation pulses of the second driving motor 89b, and the amount of movement of the antenna pedestal 82 in the Y axis direction corresponds to the number of operation pulses of the first driving motors 88a, 88b, and 88c.

Based on such conditions, in the measurement apparatus 1C according to the present embodiment, as the automatic antenna arrangement control table 16a, the number of operation pulses of the second driving motor 89b and the number of operation pulses of the first driving motors 88a, 88b, and 88c that can be arranged at the focal position F of the reflector 7 corresponding to each receiving antenna 6 are stored as control data. Therefore, in the automatic antenna arrangement control unit 16, it is possible to control the driving of the first driving motors 88a, 88b, and 88c and the second driving motor 89b based on the automatic antenna arrangement control table 16a. In this driving control, the automatic antenna arrangement control unit 16 reads the number of operation pulses of the second driving motor 89b and the number of operation pulses of the first driving motors 88a, 88b, and 88c corresponding to each receiving antenna 6 from the automatic antenna arrangement control table 16a and controls the rotation of the first driving motors 88a, 88b, and 88c and the second driving motor 89b based on the number of pulses, so that each receiving antenna 6 can be sequentially arranged at the focal position F of the reflector 7 (refer to step S4 in FIG. 9).

In the measurement apparatus (antenna apparatus) 1C according to the present embodiment, the automatic antenna arrangement means 80 for automatically arranging the receiving antenna 6 at the focal position F of the reflector in a sequential manner is provided on the XY plane. Therefore, as in the first to third embodiments, it is possible to easily perform the spurious measurement without forcing the user to perform a work for replacement of the plurality of receiving antennas 6. In particular, according to the configuration of the OTA chamber 50C having the automatic antenna arrangement means 80 according to the present embodiment, a space horizontal to the bottom surface 52a of the internal space 51 of the OTA chamber 50C is secured as an installation space of the antenna holding mechanism 81. Therefore, it is possible to prevent structural expansion of the OTA chamber 50C (housing main body 52) in the height direction. In addition, since the receiving antennas 6 slide in directions perpendicular to each other on the horizontal plane, stable movement of the reflector 7 toward the focal position F is possible.

In the measurement apparatus 1C according to the present embodiment, a plurality of first slide mechanisms 81a, 81b, and 81c are provided so as to be parallel to the Y axis direction and be spaced apart from each other by a predetermined distance in the X axis direction, and the power unit 87 is configured to include the first driving motors 88a, 88b, and 88c corresponding to the first slide mechanisms 81a, 81b, and 81c. With this configuration, the measurement apparatus 1 can easily cope with the addition of the receiving antenna 6 while avoiding an increase in the size of the OTA chamber 50C by making full use of the space in the horizontal direction on the bottom surface 52a of the housing main body 52 of the OTA chamber 50C. In the present embodiment, a plurality of first slide mechanisms and a plurality of first driving motors do not necessarily need to be provided, and one first slide mechanism and one first driving motor may be provided.

In each of the embodiments described above, an example has been mentioned in which the spurious measurement frequency band of 6 GHz to 90 GHz (refer to FIG. 8) is covered with six receiving antennas 6. However, the present invention is not limited thereto, and any spurious measurement frequency band may be covered with any number of receiving antennas 6. In addition, the means 60, 60A, 60B, and 60C for automatically arranging the receiving antenna 6 is not limited to that described in each of the above embodiments, and it is needless to say that various modes including means for manually arranging the receiving antenna 6 can be applied. In addition, the present invention can be applied not only to the anechoic box but also to the anechoic chamber.

As described above, the antenna apparatus and the measurement method according to the present invention have an effect that efficient spurious measurement in a wide frequency band for the DUT, which transmits and receives radio signals in a millimeter wave band, can be realized while avoiding an increase in the size of the anechoic box and the complication of the work for replacement of the receiving antenna. This is useful for all kinds of antenna apparatuses and measurement methods for performing spurious measurement of wireless terminals having high-speed communication capability, such as 5G wireless terminals.

DESCRIPTION OF REFERENCE NUMERALS AND SIGNS 1, 1A, 1B, 1C: measurement apparatus (antenna apparatus)
5: test antenna
6: receiving antenna (antenna)
7: reflector
10: integrated control device
16: automatic antenna arrangement control unit
20: NR system simulator (simulation measurement device)
30: signal analysis device
40: spurious signal processing unit
50: OTA chamber (anechoic box)
60, 60A, 60B: automatic antenna arrangement means (antenna arrangement means)
61, 61B: antenna holding mechanism
62, 62B: rotating body
63, 63B: rotary shaft
64, 64B: power unit
65, 65B: driving motor
80: automatic antenna arrangement means
81: antenna holding mechanism
81a, 81b, 81c: first slide mechanism
82: antenna pedestal
84: second slide mechanism
85: pedestal portion
87: power unit
87a, 87b, 87c: first driving shaft
88a, 88b, 88c: first driving motor
89a: second driving shaft
89b: second driving motor

What is claimed is:
1. An antenna apparatus, comprising:
an anechoic box having an internal space that is not influenced by a surrounding radio wave environment;
a plurality of antennas corresponding to radio signals in a plurality of divided frequency bands set in advance;
a reflector that is housed in the internal space and has a predetermined paraboloid of revolution, radio signals transmitted or received by an antenna to be tested provided in a device under test being reflected through the paraboloid of revolution; and
antenna arrangement means for sequentially arranging the plurality of antennas at a focal position, which is determined from the paraboloid of revolution, according to the divided frequency bands.
2. The antenna apparatus according to claim 1,
wherein the antenna to be tested uses a radio signal in a specified frequency band,
the divided frequency bands are partial frequency bands of a predetermined spurious frequency band from a frequency band lower than the specified frequency band to a frequency band higher than the specified frequency band, and
the anechoic box further includes:
a test antenna that uses a radio signal in the specified frequency band;
a simulation measurement device that outputs a test signal to the device under test through the test antenna, receives a measurement target signal output from the device under test, to which the test signal has been input, through the test antenna, and measures a radio signal in the specified frequency band based on the received measurement target signal; and
a signal analysis device that receives a radio signal in the spurious frequency band, which is output together with the measurement target signal from the device under test to which the test signal has been input, through each of the antennas corresponding to the divided frequency bands and analyzes a frequency distribution and power of the received radio signal in the spurious frequency band.

3. The antenna apparatus according to claim 2, wherein the antenna holding mechanism is provided on a bottom surface of the internal space of the anechoic box, and is formed by the rotating body rotatable along a plane in a vertical direction by the rotary shaft along a horizontal direction.

4. The antenna apparatus according to claim 2, wherein the antenna arrangement means operates automatically, and includes:
an antenna holding mechanism that is provided in the internal space of the anechoic box such that each of the antennas is arranged on a circumference around a rotary shaft in a rotating body rotatable with the rotary shaft as a center, the focal position is located on the circumference, and each of the antennas passes through the focal position by rotation of the rotating body;
a power unit having a driving motor for rotationally driving the rotating body through the rotary shaft; and
an automatic antenna arrangement control unit that controls the driving motor such that each of the antennas is sequentially stopped at the focal position according to the divided frequency bands.

5. The antenna apparatus according to claim 2, wherein the antenna arrangement means includes:
an antenna holding mechanism that has a first slide mechanism that holds a plurality of antenna pedestals, on which the antennas are provided, so as to be slidable in one direction while maintaining a predetermined interval and a second slide mechanism that slidably holds the first slide mechanism in the other direction perpendicular to the one direction through a pedestal portion and that is provided in the internal space of the anechoic box such that each of the antennas is able to pass through the focal position;
a power unit that includes a first driving motor for rotationally driving a first driving shaft for sliding each of the antenna pedestals in the one direction and a second driving motor for rotationally driving a second driving shaft for sliding the pedestal portion in the other direction; and
an automatic antenna arrangement control unit that controls the first and second driving motors such that each of the antennas is sequentially stopped at the focal position according to the divided frequency bands.

6. The antenna apparatus according to claim 1, wherein the antenna arrangement means operates automatically, and includes:
an antenna holding mechanism that is provided in the internal space of the anechoic box such that each of the antennas is arranged on a circumference around a rotary shaft in a rotating body rotatable with the rotary shaft as a center, the focal position is located on the circumference, and each of the antennas passes through the focal position by rotation of the rotating body;
a power unit having a driving motor for rotationally driving the rotating body through the rotary shaft; and
an automatic antenna arrangement control unit that controls the driving motor such that each of the antennas is sequentially stopped at the focal position according to the divided frequency bands.

7. The antenna apparatus according to claim 6, wherein the antenna holding mechanism is provided on a bottom surface of the internal space of the anechoic box, and is formed by the rotating body rotatable along a plane in a horizontal direction by the rotary shaft along a vertical direction.

8. The antenna apparatus according to claim 7, wherein the antenna holding mechanism holds each of the antennas such that a receiving surface of each of the antennas is directed to the rotary shaft side.

9. The antenna apparatus according to claim 7, wherein the antenna holding mechanism holds each of the antennas such that a receiving surface of each of the antennas is directed to an opposite side to the rotary shaft side.

10. The antenna apparatus according to claim 7, wherein, in a case where each of the antennas is stopped at the focal position, the antenna holding mechanism holds the antenna so as to face the reflector at an angle at which a receiving surface of the antenna is perpendicular to a beam axis of the radio signal.

11. The antenna apparatus according to claim 6, wherein the antenna holding mechanism holds each of the antennas such that a receiving surface of each of the antennas is directed to the rotary shaft side.

12. The antenna apparatus according to claim 11, wherein, in a case where each of the antennas is stopped at the focal position, the antenna holding mechanism holds the antenna so as to face the reflector at an angle at which a receiving surface of the antenna is perpendicular to a beam axis of the radio signal.

13. The antenna apparatus according to claim 6, wherein the antenna holding mechanism holds each of the antennas such that a receiving surface of each of the antennas is directed to an opposite side to the rotary shaft side.

14. The antenna apparatus according to claim 13, wherein, in a case where each of the antennas is stopped at the focal position, the antenna holding mechanism holds the antenna so as to face the reflector at an angle at which a receiving surface of the antenna is perpendicular to a beam axis of the radio signal.

15. The antenna apparatus according to claim 6, wherein, in a case where each of the antennas is stopped at the focal position, the antenna holding mechanism holds the antenna so as to face the reflector at an angle at which a receiving surface of the antenna is perpendicular to a beam axis of the radio signal.

16. The antenna apparatus according to claim 1, wherein the antenna arrangement means includes:
an antenna holding mechanism that has a first slide mechanism that holds a plurality of antenna pedestals, on which the antennas are provided, so as to be slidable in one direction while maintaining a predetermined interval and a second slide mechanism that slidably holds the first slide mechanism in the other direction perpendicular to the one direction through a pedestal portion and that is provided in the internal space of the anechoic box such that each of the antennas is able to pass through the focal position;

a power unit that includes a first driving motor for rotationally driving a first driving shaft for sliding each of the antenna pedestals in the one direction and a second driving motor for rotationally driving a second driving shaft for sliding the pedestal portion in the other direction; and an automatic antenna arrangement control unit that controls the first and second driving motors such that each of the antennas is sequentially stopped at the focal position according to the divided frequency bands.

17. The antenna apparatus according to claim 16, wherein a plurality of the first slide mechanisms are provided so as to be parallel to the one direction and be spaced apart from each other by a predetermined distance in the other direction, and the power unit includes the first driving motor corresponding to each of the first slide mechanisms.

* * * * *